(12) United States Patent
Shiota

(10) Patent No.: US 6,171,932 B1
(45) Date of Patent: Jan. 9, 2001

(54) SEMICONDUCTOR SUBSTRATE AND PRODUCTION METHOD THEREOF

(75) Inventor: Iku Shiota, Isehara (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 09/357,979

(22) Filed: Jul. 21, 1999

(30) Foreign Application Priority Data

| Jul. 23, 1998 | (JP) | 10-208033 |
|---|---|---|
| Jul. 23, 1998 | (JP) | 10-208034 |
| Jul. 23, 1998 | (JP) | 10-208035 |

(51) Int. Cl.$^7$ .......................... H01L 21/30; H01L 21/46; H01L 21/76; H01L 21/00
(52) U.S. Cl. ........................ 438/455; 438/406; 438/149
(58) Field of Search .................. 438/455, 458, 438/464, 459, 149, 406, 514, 526; 257/347

(56) References Cited

U.S. PATENT DOCUMENTS

| 5,371,037 | 12/1994 | Yonehara | 437/86 |
| 5,374,564 | * 12/1994 | Bruel | 437/24 |
| 5,385,864 | * 1/1995 | Kawasaki et al. | 437/132 |
| 5,405,802 | * 4/1995 | Yamagata et al. | 437/71 |
| 5,453,394 | 9/1995 | Yonehara et al. | 437/62 |
| 5,466,303 | * 11/1995 | Yamaguchi et al. | 148/33 |
| 5,641,707 | 6/1997 | Moslehi | 438/513 |
| 5,773,151 | 6/1998 | Begley et al. | 428/446 |
| 5,773,355 | 6/1998 | Inoue et al. | 438/459 |
| 5,854,123 | * 12/1998 | Sato et al. | 438/507 |
| 5,856,229 | 1/1999 | Sakaguchi et al. | 438/406 |
| 5,953,622 | * 9/1999 | Lee et al. | 438/458 |
| 6,027,988 | * 2/2000 | Cheung et al. | 438/513 |

FOREIGN PATENT DOCUMENTS

| 0767486 | 4/1997 | (EP) . |
| 6-326280 | 11/1994 | (JP) . |
| 8-024551 | 1/1996 | (JP) . |
| 10-165730 | 6/1998 | (JP) . |

OTHER PUBLICATIONS

Journal of the Electrochemical Society; N. Sato et al.; "Epitaxial Growth on Porous Si for a New Bond and Etchback Silicon–on–Insulator"; vol. 142, No. 9, Sep. 1995, pp. 3116–3122.

\* cited by examiner

Primary Examiner—Matthew Smith
Assistant Examiner—Lex H. Malsawma
(74) Attorney, Agent, or Firm—Fitzpatrick, Cella, Harper & Scinto

(57) ABSTRACT

In order to provide a semiconductor substrate that can be an SOI substrate suitable for production of high-frequency transistor, the semiconductor substrate is produced by a method of producing the semiconductor substrate having a step of bonding a first base having a semiconductor layer region to a second base and a step of removing the first base while leaving the semiconductor layer region on the second base, wherein a magnitude relation between the concentration of a p-type impurity and the concentration of an n-type impurity in the bonding atmosphere is established according to the composition of the second base.

50 Claims, 16 Drawing Sheets

SEMICONDUCTOR SUBSTRATE AND PRODUCTION METHOD THEREOF

BACKGROUND OF THE INVENTION

1. Field of the Invention

The present invention relates to a semiconductor substrate called an SOI substrate or the like and a method of producing the same.

2. Related Background Art

There are known methods for producing the SOI substrate having a single-crystal semiconductor thin film in such a manner that an Si wafer as a first base is bonded to another Si wafer as a second base with an insulating layer being interposed therebetween and a part of the first base on the back surface side is removed to make the single-crystal semiconductor thin film transferred onto the second base.

Particularly, the methods utilizing a porous layer, described in Japanese Patent Publication No. 2608351 and U.S. Pat. No. 5,371,037, are excellent methods to obtain an SOI substrate with good quality.

Further, U.S. Pat. No. 5,374,564 also describes a method of producing an SOI substrate making use of a layer with microbubbles (porous layer) formed by execution of ion implantation of hydrogen ions and a heat treatment.

The inventor prepared SOI substrates according to the description of the above patents. The inventor then made an MOS transistor using these SOI substrates and found that in application of this transistor to a high-frequency circuit, more improvement was required in high-frequency characteristics of the transistor and the circuit.

SUMMARY OF THE INVENTION

An object of the present invention is to provide a semiconductor substrate that can be an SOI substrate suitable for production of a high-frequency transistor, at a high yield.

Another object of the present invention is to provide a semiconductor substrate having a semiconductor layer region comprising a single-crystal semiconductor through an insulating layer on a support substrate comprising a semiconductor, wherein the support substrate has such a composition that a semiconductor surface portion immediately below the insulating layer is a semiconductor having a resistivity of not less than 100 Ωcm and/or such a composition that the support substrate has a region with increasing resistivity toward the insulating layer in the direction of thickness thereof, and to provide a production method thereof.

Still another object of the present invention is to provide a method of producing a semiconductor substrate comprising a step of bonding a first base comprising a semiconductor layer region to a second base and a step of removing the first base while leaving the semiconductor layer region on the second base, wherein according to the composition of the second base, a magnitude relation is established between the concentration of an n-type impurity and the concentration of a p-type impurity in an atmosphere for carrying out the bonding step.

Another object of the present invention is to provide a semiconductor device formed in a semiconductor substrate having a semiconductor layer region comprising a single-crystal semiconductor through an insulating layer on a support substrate comprising a semiconductor, wherein the support substrate has such a composition that a semiconductor surface portion immediately below the insulating layer is a semiconductor having a resistivity of not less than 100 Ωcm and/or such a composition that the support substrate has a region with increasing resistivity toward the insulating layer in the direction of thickness thereof.

A method of producing a semiconductor substrate according to a preferred embodiment of the present invention is a method of producing a semiconductor substrate comprising a step of bonding a first base comprising a semiconductor layer region to a second base and a step of removing the first base while leaving the semiconductor layer region on the second base, wherein the bonding step is carried out in an atmosphere in which the concentration of an n-type impurity is lower than the concentration of a p-type impurity, and wherein the second base is a base comprising a portion comprising an n-type semiconductor having a resistivity of not less than 100 Ωcm on the bonding surface side.

A method of producing a semiconductor substrate according to another preferred embodiment of the present invention is a method of producing a semiconductor substrate comprising a step of bonding a first base comprising a semiconductor layer region to a second base and a step of removing the first base while leaving the semiconductor layer region on the second base, wherein the bonding step is carried out in an atmosphere in which the concentration of a p-type impurity is lower than the concentration of an n-type impurity, and wherein the second base is a base comprising a portion comprising a p-type semiconductor having a resistivity of not less than 100 Ωcm on the bonding surface side.

A method of producing a semiconductor substrate according to still another preferred embodiment of the present invention is a method of producing a semiconductor substrate comprising a step of bonding a first base comprising a semiconductor layer region to a second base and a step of removing the first base while leaving the semiconductor layer region on the second base, wherein the bonding step is carried out in an atmosphere in which the concentration of a p-type impurity is lower than the concentration of an n-type impurity, and wherein the second base is a base comprising a portion comprising an n-type semiconductor having a resistivity of not less than 300 Ωcm and having an insulating layer formed on the bonding surface side.

A semiconductor substrate according to a preferred embodiment of the present invention is a semiconductor substrate having a semiconductor layer region comprising a single-crystal semiconductor through an insulating layer on a support substrate comprising a semiconductor, wherein the support substrate has a region with increasing resistivity toward the insulating layer in the direction of thickness thereof near the insulating layer.

Another semiconductor substrate according to a preferred embodiment of the present invention is a semiconductor substrate having a semiconductor layer region comprising a single-crystal semiconductor through an insulating layer on a support substrate comprising an n-type semiconductor, wherein the support substrate has a region with decreasing resistivity toward the insulating layer in the direction of thickness thereof and wherein the resistivity of a portion immediately below the insulating layer is not less than 100 Ω·cm.

According to the present invention described above, the decrease of resistivity is restrained near the surface of the support substrate immediately below the insulating layer in the production of the SOI substrate.

DETAILED DESCRIPTION OF THE PREFERRED EMBODIMENTS

In order to facilitate understanding of the present invention, the technological findings leading to the accomplishment of the present invention will be described prior to the description of the embodiments of the present invention. (Experiment 1)

A first experiment of the method of producing the SOI substrate carried out by the inventor will be described by reference to FIGS. 19A to 19D.

Figure 19A:
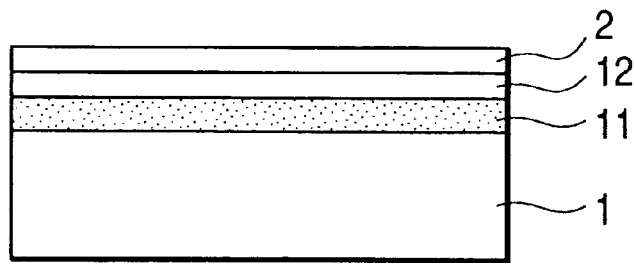
FIGS. 19A, 19B, 19C and 19D are schematic sectional views showing the production steps of an SOI substrate.

Prepared as a first base 1 is an Si wafer having a porous layer 11, a semiconductor layer region 12 made of a single-crystal semiconductor, and an insulating layer 2 made of silicon oxide (FIG. 19A).

Specifically, a surface of an Si wafer is changed into a porous surface by anodization, thereafter a semiconductor layer is epitaxially grown, and the surface of the semiconductor layer region 12 undergoes thermal oxidation, thereby obtaining the Si wafer as illustrated in FIG. 19A.

Alternatively, the porous layer may also be made by thermally oxidizing the surface of the Si wafer and thereafter carrying out ion implantation of hydrogen ions to form microbubbles in the wafer.

Figure 19B:
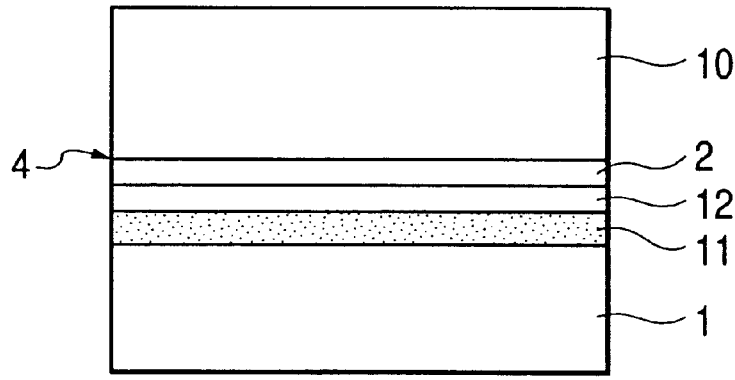

Next, as illustrated in FIG. 19B, another Si wafer is prepared as a second base 10, for example, and a heat treatment is carried out at the temperature of about 900° C. to 1200° C. while a bonding surface of the insulating layer 2 of the above first base is kept in contact with a bonding surface of Si of the second Si wafer. This heat treatment effects bonding of the first and second bases 1, 10, thereby obtaining a multi-layer structure. Numeral 4 denotes a bonding interface.

Figure 19C:
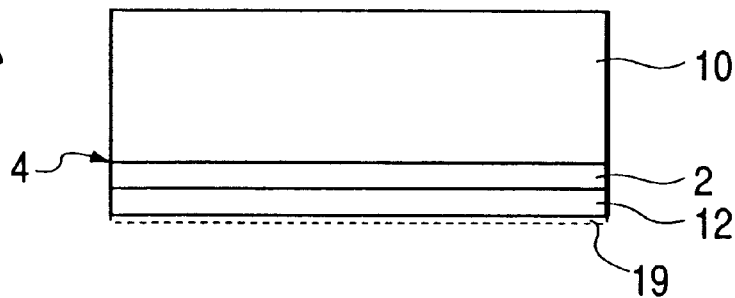
Figure 19D:
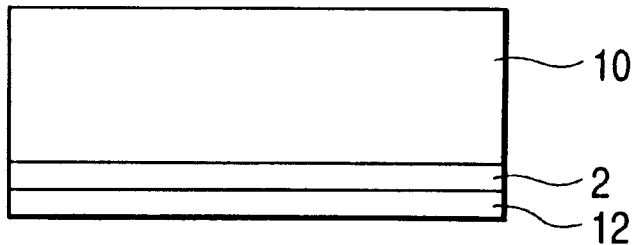

Then, as illustrated in FIG. 19C, the porous layer 11 and the first base 1 on the back surface side thereof are removed by grinding, polishing, wet etching, or dry etching. Alternatively, the first base 1 is removed by splitting the bonded structure at the border of the porous layer 11.

The surface (exposed surface) of the semiconductor layer region 12 obtained in this way is a rough surface 19 due to the effect of the porous layer 11.

The rough surface 19 is smoothed by polishing or by a heat treatment in a reducing atmosphere containing hydrogen. Obtained in this way is the SOI substrate having the second base 10 of the Si wafer as a support substrate and the semiconductor layer region 12 of single-crystal Si thereon with the insulating layer (buried insulating layer) 2 therebetween.

More specifically, the first and second bases used in this Experiment 1 were CZ wafers of boron (B)-doped p-type single-crystal Si having the resistivity of 10 Ωcm, which were easiest to get. Then the SOI substrate was produced according to the steps described above.

The CZ wafers are wafers obtained from a single-crystal ingot formed by the Czochralski method.

Then a transistor circuit was fabricated using this SOI substrate.

However, this transistor circuit was inferior in high-frequency characteristics. The reason was that the resistance was low in the part being the support substrate (which was of the p-type CZ wafer) in the SOI substrate.

The high-frequency characteristics were degraded because of increase of parasitic capacitance in the structure of the SOI layer, the buried insulating film, and the support substrate of the SOI substrate, and increase of leak current.

If the support substrate is an insulator like silica glass the resistance of the support substrate can be kept high. Adoption of the insulator, however, does not present solution to all the issues.

Many systems for production of semiconductor devices are produced for the purpose of processing bulk Si wafers such as the CZ wafers or the like. The silica glass is different from Si in such characteristics as thermal conductivity, coefficient of thermal expansion, light transmittance, and so on. Therefore, in the case of processing of the SOI substrate whose support substrate is made of the insulator like silica glass, process parameters of the apparatus for production of semiconductor devices have to be readjusted to a considerable degree. For the same reason, there are cases in which considerable change may be required for structure design and circuit design of semiconductor devices, and the like.

From these aspects, use of the semiconductor such as Si for the support substrate is more suitable for general purpose application.

(Experiment 2)

The SOI substrate was produced according to the aforementioned method, using wafers with a higher resistivity, for example, p-type FZ wafers having the resistivity of 1000 Ωcm, instead of the p-type CZ wafers. The transistor circuit was made using it, but the high-frequency characteristics expected were not achieved.

(Experiment 3)

Analysis was conducted as to impurity distribution of the SOI substrate produced in above Experiment 2. It was verified from the result that boron was detected in higher concentrations near the surface of the p-type FZ wafer immediately below the buried insulating layer and that the region of interest was thus of the p-type of a high impurity concentration and had the low resistance of about 1 Ωcm to 10 Ωcm.

(Experiment 4)

The concentration of boron and the concentration of phosphorus were measured in a space inside a clean room in which the bonding and heat treatment were carried out in Experiment 2.

The concentration of boron was 0.08 ng/liter, and the concentration of phosphorus less than 0.002 ng/liter.

Incidentally, the system was constructed in such structure that an HEPA (High Efficient Particulate Air) filter comprised of boron-containing glass fibers was used in the space inside the above clean room and clean air was supplied through the HEPA filter.

(Experiment 5)

The concentrations of boron and phosphorus were measured in a clean room in which clean air was supplied through a ULPA (Ultra Low Penetration Air) filter comprised of boron-free PTFE (polytetrafluoroethylene) and through a boron-adsorbing chemical filter.

The concentration of boron was less than 0.0003 ng/liter and the concentration of phosphorus less than 0.001 ng/liter.

The concentrations of arsenic and antimony were less than the detection limit and thus were negligible relative to the above boron concentration.

The HEPA filter, ULPA filter, and chemical filter are known, for example, in Japanese Patent Application Laid-Open Nos. 10-165730, 8-24551, and so on.

It became apparent from the results of the above experiments that to maintain the semiconductor surface part of the support substrate at a high resistance was able to be achieved at a high yield and readily by defining the magnitude relation between the concentration of a p-type impurity and the concentration of an n-type impurity in an atmosphere for execution of the bonding step, according to the composition of the base being the support substrate in the bonded semiconductor substrate.

Now production methods of semiconductor substrates will be described below according to three types of typical embodiments of the present invention.

Embodiments 1 to 3 are examples where the base becoming the support substrate is a high-resistance semiconductor of the p-type and where an atmosphere selected is one in which the concentration of a p-type impurity is lower than the concentration of an n-type impurity.

(Embodiment 1)

Figure 1A:
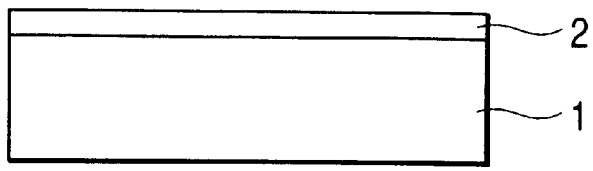
FIGS. 1A, 1B and 1C are schematic sectional views showing the steps of Embodiment 1 of the present invention.
Figure 1B:
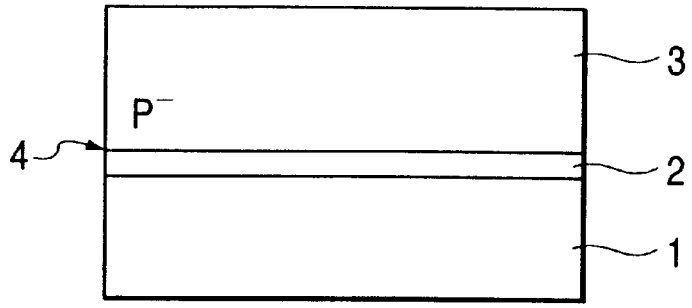
Figure 1C:
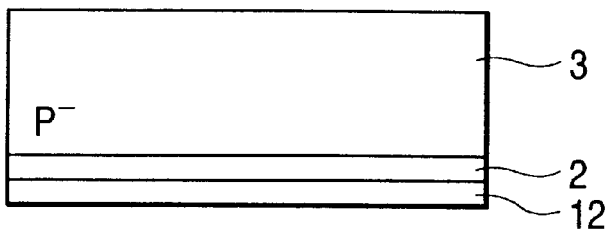

FIGS. 1A to 1C show a method of producing a semiconductor substrate according to the present invention.

As illustrated in FIG. 1A, for example, the Si wafer is prepared as the first base 1 and the insulating layer 2 is formed on the surface thereof.

Prepared as a separate base from the first base is the second base 3 of a high-resistance p-type semiconductor having the resistivity of not less than 100 Ωcm.

Figure 2:
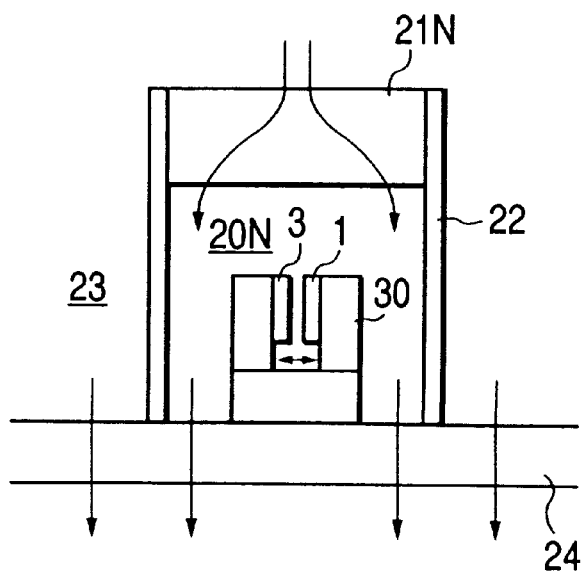
FIG. 2 is a schematic, sectional view showing a bonding space provided in a clean room, as used in the present invention.

The first base 1 having the insulating layer 2, and the second base 3, prepared as described above, are bonded to each other in a bonding atmosphere 20N as illustrated in FIG. 2. Numeral 4 designates the bonding interface.

FIG. 2 shows a bonding space provided in a clean room 23, in which 21N is a low-boron-releasing filter, for example such as the PTFE filter or the like, and/or a boron-adsorbing chemical filter, 22 a bulkhead, 24 a floor, and 30 a bonding device. The atmosphere 20N in this space is cleaned to the high cleanliness of class 1 of Federal Standard 209D of U.S.A. or a higher cleanliness as occasion may demand.

From the multi-layer structure obtained by bonding of the first base 1 and the second base 3, the first base is removed except for the semiconductor layer region 12 near the side of the insulating layer 2 of the first base by at least one removing method selected from grinding, polishing, etching, and so on.

Further, the substrate obtained is subjected to a heat treatment in a reducing atmosphere containing hydrogen, if necessary, thereby obtaining the SOI substrate illustrated in FIG. 1C.

Figure 3:
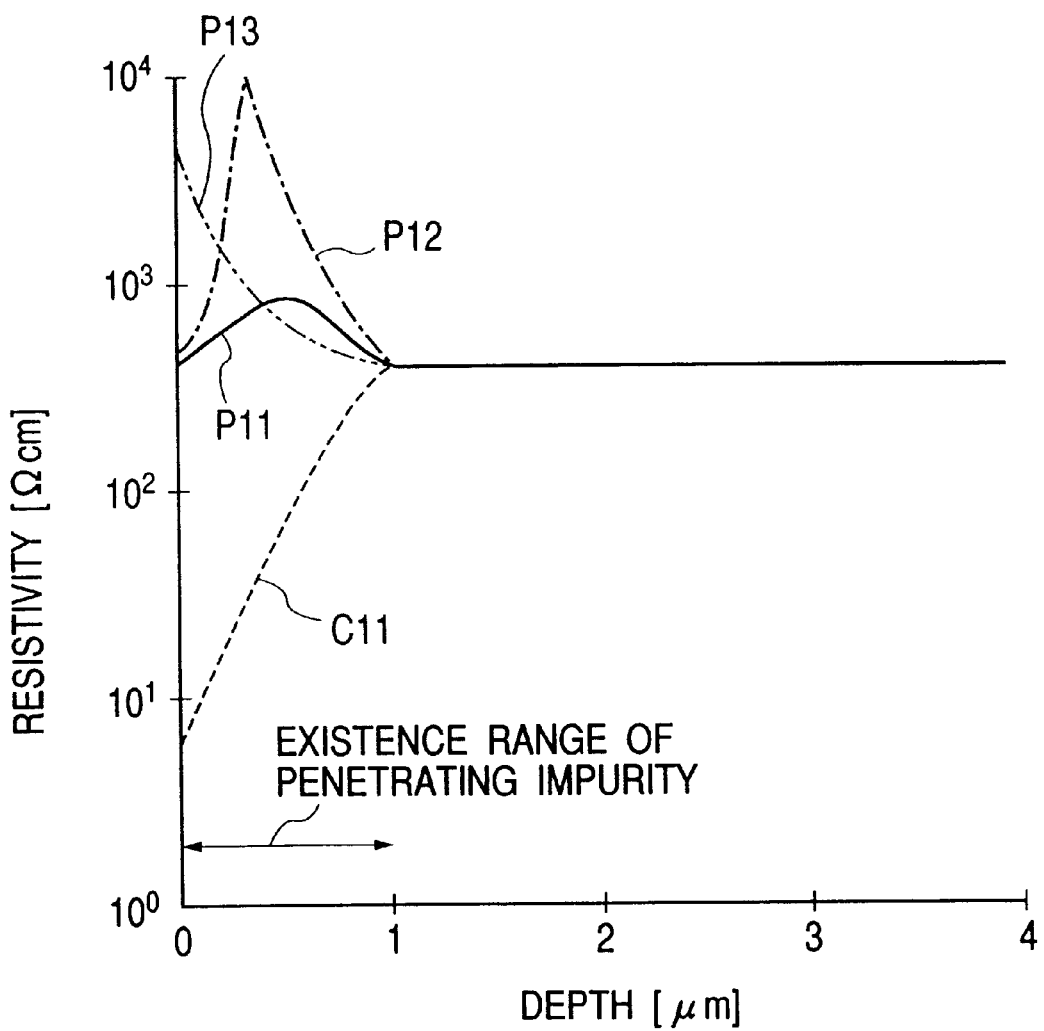
FIG. 3 is a graph showing the dependence of resistivity on the depth of various support substrates.

FIG. 3 shows depth dependence of resistivity in various support substrates.

This figure shows resistivity profiles (P11, P12, P13) of support substrates where bonding was carried out in various atmospheres, using the p-type Si wafer having the resistivity of 300 Ωcm as the second base, and a resistivity profile (C11) of a support substrate where an n-type Si wafer was used as the second base.

P11 indicates the resistivity profile where the concentration Cn of an n-type impurity moving (penetrating) from the bonding atmosphere into the second base is two times the concentration Cp of a p-type impurity contained in the second base, P12 the resistivity profile where Cn is equal to Cp, and P13 the resistivity profile where Cn is 0.1 times Cp.

P11 to P13 all show the profiles in which the resistivity becomes higher toward the surface of the support substrate, i.e., toward the interface with the insulating layer, and, therefore, they are left-increasing profiles in FIG. 3 in the vicinity of the buried insulating layer (at least within 2 μm from the interface).

Particularly, P13 has no region where the profile becomes decreasing to the left and has the higher resistivity near the interface than that of the bulk. Therefore, P13 is more preferable.

In the case where the n-type wafer having the resistivity of 300 Ωcm is used as the second base, as indicated by C11, the n-type impurity diffuses from the bonding atmosphere into the wafer to decrease the resistivity near the interface considerably.

The bonding atmosphere used in the present invention does not mean only the atmosphere at the place where the bonding is carried out actually, but also means an atmosphere to determine a deposition state of impurities on the actual bonding surface. Namely, where the concentration of a p-type or n-type impurity in the actual bonding atmosphere is so very low as not to cause decrease of resistivity, it is dependent on an atmosphere immediately before placement of the second base in that atmosphere. In that case, therefore, the atmosphere immediately before the placement can also be regarded as a bonding atmosphere.

The concentration (Nn) of an n-type impurity in the bonding atmosphere is preferably not more than 0.1 ng/liter and more preferably not more than 0.01 ng/liter and the concentration (Np) of a p-type impurity in the bonding atmosphere is preferably not more than 0.01 ng/liter and more preferably not more than 0.001 ng/liter. In addition, it is necessary to satisfy the relation of Nn>Np.

As long as the relation of Nn>Np is met, lower limits of Nn, Np do not have to be defined; however, in order to facilitate management of the atmosphere and restrain the production and running cost, Nn and Np both are preferably not less than 0.0001 ng/liter.

The above atmosphere can be an atmosphere formed in a clean room or in a local clean room of a high cleanliness placed in another clean room, or an atmosphere formed in a closed chamber.

In the former case, the principal component of the atmosphere is the clean air of the high cleanliness of class 1 level as mentioned above, and in the latter case, the principal component of the atmosphere can be an inert gas such as nitrogen, argon, helium, neon, or xenon, or oxygen.

For example, in the case of a clean room using the boron-releasing HEPA filter without use of the PTFE filter, $B_2O_3$ contained in the filter-constituting glass reacts with hydrofluoric acid (HF) in the clean room to evolve boron fluoride ($BF_3$) ($B_2O_3+6HF \rightarrow 2BF_3+3H_2O$).

In the bonding atmosphere of the clean room, the boron concentration is much greater than 0.01 ng/liter and is higher than the phosphorus concentration in the same atmosphere accordingly. Therefore, when the bonding is carried out in such an atmosphere, the resistivity profile will be one similar to that of C11 of FIG. 3 even if the high-resistance p-type wafer is used as the second base as in Experiments 2 and 3.

The second base used in the present invention is of a base material containing at least a region comprising a p-type semiconductor having a resistivity of not less than 100 Ωcm, more preferably not less than 500 Ωcm, and still more preferably not less than 1000 Ωcm on the bonding surface side.

Particularly, an Si wafer with the above resistivity produced by the floating zone process (FZ wafer) is preferably used as the second base, but the second base may be a CZ wafer.

Further, it is also preferable to form the insulating layer on the surface of the above second base and thereafter bond the first base thereto with the surface of the insulating layer as a bonding surface.

In this case, since this insulating layer acts as a barrier against penetration of a p-type impurity, the region immediately below the buried insulating layer becomes more resistant to decrease of the resistivity. Silicon oxide is preferably used as such an insulating layer, and the thickness of the insulating layer enough for the action as the barrier is not less than 100 nm and more preferably not less than 200 nm nor more than 10 μm.

The two bases can be bonded to each other more easily without formation of voids or the like at the bonding interface when one of the bonding surfaces of the first and second bases to be bonded is a surface of a semiconductor of Si or the like and the other is a surface of an insulator such as silicon oxide or the like.

In cases where two surfaces each comprised of an insulator are bonded to each other, it is desirable to bond them after an element such as oxygen, nitrogen, silicon, or the like is introduced into at least one of the bonding surfaces by plasma ion implantation or the like.

(Embodiment 2)

Next described is Embodiment 2 resulting from partial modification of Embodiment 1 described above. Reference is made to "J. Electrochem. Soc., Vol. 142, No. 9, September 1995, pp. 3116–3122" as to the details of the method of producing an SOI substrate using the porous layer.

A surface of a p-type Si wafer as the first base 1 is anodized to make the surface porous. Then a semiconductor layer region of non-porous single-crystal Si is formed on the porous surface by epitaxial growth.

Then the surface of the semiconductor layer region 12 is oxidized to form the insulating layer 2 as occasion may demand.

Figure 4A:
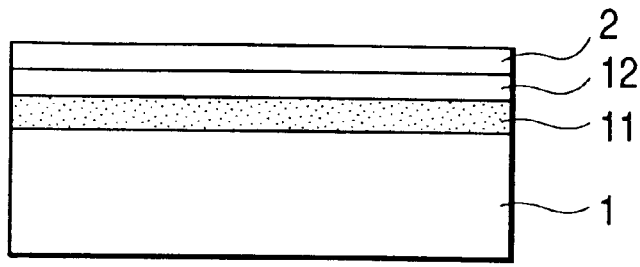
FIGS. 4A, 4B, 4C and 4D are schematic sectional views showing the steps of Embodiment 2 of the present invention.

In this way, the first base is obtained as illustrated in FIG. 4A.

Figure 4B:
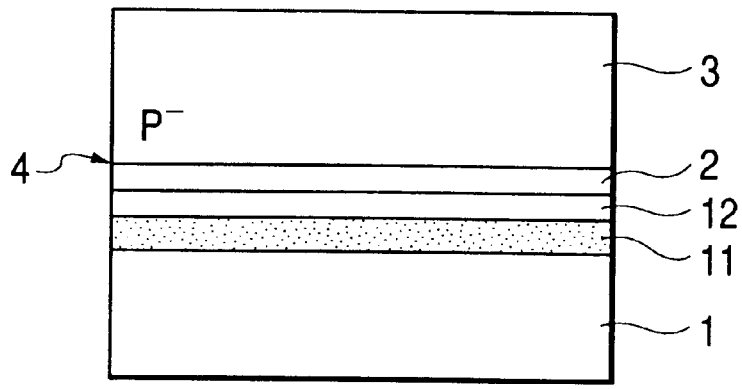

The second base 3 like the p-type FZ Si wafer with a high resistivity described in Embodiment 1 is prepared and is placed, together with the first base, in the bonding atmosphere where the p-type impurity concentration is low (Np<Nn). In the atmosphere they are placed so that the surface of the insulating layer 2 is in close contact with the surface of the p-type FZ Si wafer. At this time a heat treatment at 900° C. to 1200° C. is carried out as occasion may demand. In this way the multi-layer structure as illustrated in FIG. 4B is obtained.

Figure 4C:
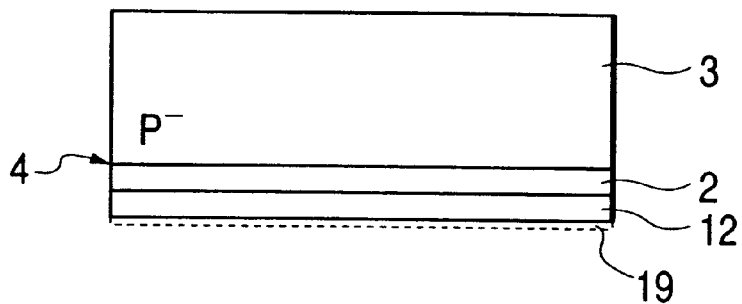

After that, the non-porous part on the surface side of the first base 1 is removed by grinding, polishing, or etching and the porous layer 11 is removed by selective wet etching with an etchant containing hydrogen fluoride and hydrogen peroxide, thereby obtaining the SOI substrate as illustrated in FIG. 4C.

Alternatively, a fluid or a wedge is driven against or into the side face of the multi-layer structure, or tension is applied in directions to separate the first base and the second base from each other, or the like, whereby the two members are separated from each other at the border of the porous layer with a low mechanical strength, thereby obtaining an SOI substrate with the semiconductor layer region 12 being left on the second base.

Further, the substrate is subjected to a heat treatment in a reducing atmosphere of hydrogen 100% or in a reducing atmosphere of hydrogen diluted with an inert gas for one or more hours, whereby the rough surface 19 of the semiconductor layer region is smoothed so that the surface roughness of the SOI substrate becomes sufficiently smooth to Rrms not more than 5 nm.

Figure 4D:
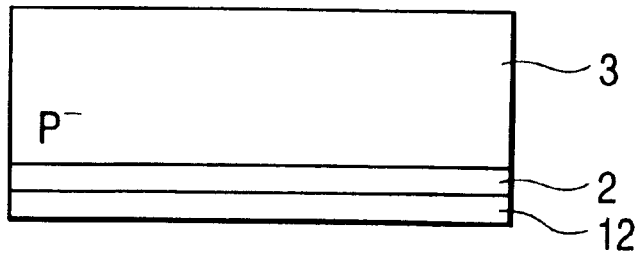

The SOI substrate as illustrated in FIG. 4D is obtained in this way.

Since in this SOI substrate the support substrate 3 below the buried insulating layer 2 has a sufficiently high resistivity of not less than 100 Ω·cm, the transistor produced with this SOI substrate has less leak current and can operate at a high speed.

(Embodiment 3)

Embodiment 3 is also an example resulting from partial modification of Embodiment 1.

Figure 5A:
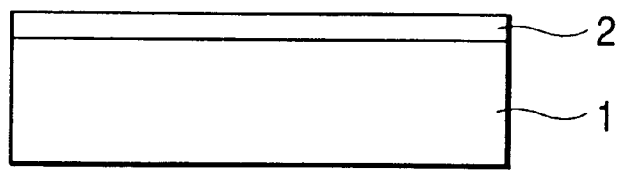
FIGS. 5A, 5B, 5C and 5D are schematic sectional views showing the steps of Embodiment 3 of the present invention.

As illustrated in FIG. 5A, the insulating layer 2 is formed on the surface of the first base 1 comprised of a semiconductor such as the Si wafer.

Figure 5B:
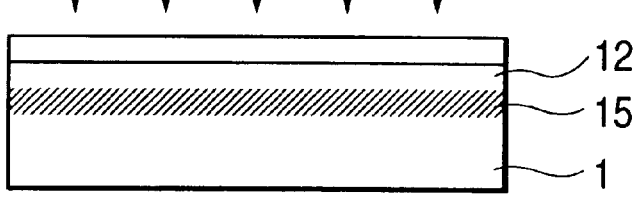

As illustrated in FIG. 5B, hydrogen ions or rare gas ions are implanted by ion implantation in the region about 100 nm to 2 μm below the lower surface of the insulating layer 2 of the first base 1 to form an ion-implanted layer 15 for creation of microbubbles. After that, it may be subjected to a heat treatment at 100° C. to 400° C. to evolve the microbubbles in the ion-implanted layer 15 if necessary.

Figure 5C:
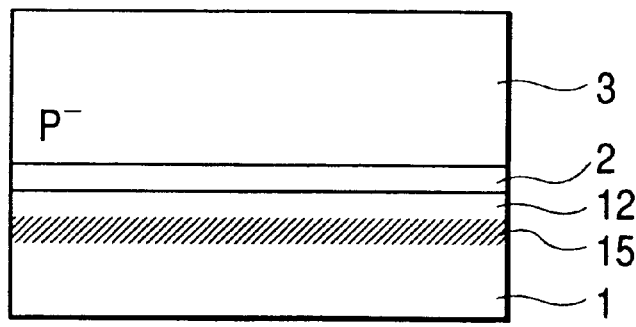

As illustrated in FIG. 5C, the second base 3, which is comprised of a semiconductor like a high-resistance p-type Si wafer or the like as described in Embodiment 1, is prepared and is brought into close contact with the insulating layer 2 in the atmosphere 20N illustrated in FIG. 2. Then the substrate is subjected to a heat treatment at 500° C. to 1200° C. to aggregate the microbubbles evolved in the ion-implanted layer 15 or to newly evolve and aggregate the microparticles therein. Then the ion-implanted layer becomes fragile, and the first base 1 of the multi-layer structure is separated at the border of the ion-implanted layer 15 while the semiconductor layer region 12 is left.

Figure 5D:
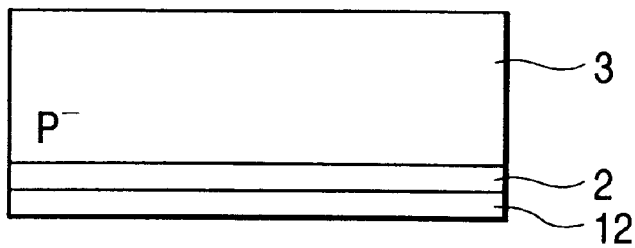

Then the exposed surface of the semiconductor region 12 is smoothed by polishing or by a heat treatment in a reducing atmosphere containing hydrogen to obtain the SOI substrate with relatively good quality, though inferior to that of Embodiment 1, as illustrated in FIG. 5D.

The SOI substrate thus obtained is one with the support substrate having the resistivity profile as indicated by either of P11 to P13 of FIG. 3, depending on the penetration amount of impurities or the distribution state thereof.

Embodiments 4 to 6 described below are examples where an n-type high-resistance semiconductor is used as the support substrate and where the atmosphere selected is one in which the concentration of an n-type impurity is lower than the concentration of a p-type impurity.

(Embodiment 4)

Figure 6A:
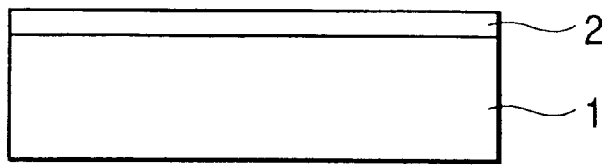
FIGS. 6A, 6B and 6C are schematic sectional views showing the steps of Embodiment 4 of the present invention.
Figure 6B:
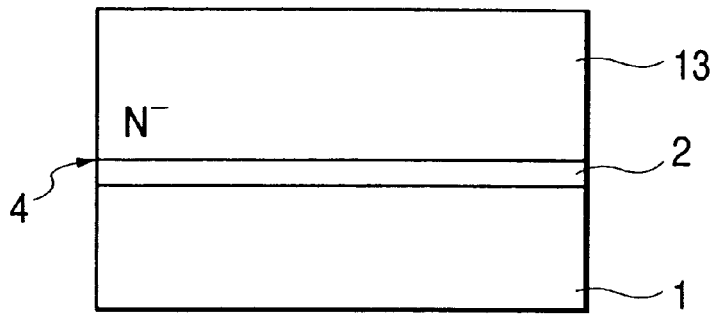
Figure 6C:
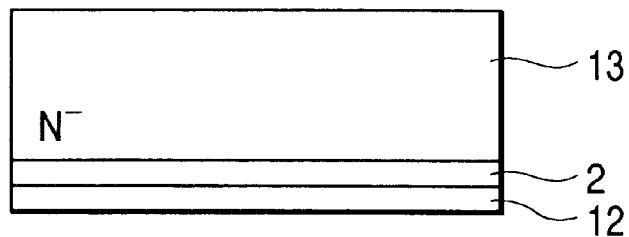

FIGS. 6A to 6C show another method of producing a semiconductor substrate according to the present invention.

As illustrated in FIG. 6A, for example, an Si wafer is prepared as the first base 1 and an insulating layer 2 is formed on the surface thereof.

Prepared as a separate base from the first base is the second base 13 of a high-resistance n-type semiconductor having the resistivity of not less than 100 Ωcm.

Figure 7:
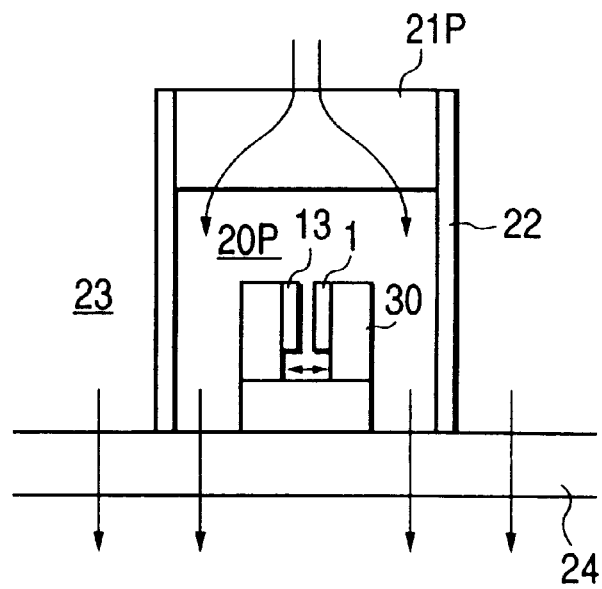
FIG. 7 is a schematic, sectional view showing a bonding space provided in a clean room, as used in the present invention.

The first base 1 having the insulating layer 2, and the second base 13, prepared as described above, are bonded to each other in a bonding atmosphere 20P as illustrated in FIG. 7. Numeral 4 designates the bonding interface.

FIG. 7 shows the bonding space provided in clean room 23, in which 21P is a boron-releasing filter, for example such as the HEPA filter or the like, 22 the bulkhead, 24 the floor, and 30 the bonding device. The atmosphere 20P in this space is cleaned to the cleanliness of class 1 to 100 of Federal Standard 209D of U.S.A. as occasion may demand.

From the multi-layer structure obtained by bonding of the first base 1 and the second base 13, the first base is removed except for the semiconductor layer region 12 near the side of the insulating layer 2 of the first base by one of the removing methods as discussed in above Embodiment 1.

Further, the substrate obtained is subjected to a heat treatment in a reducing atmosphere containing hydrogen if necessary, thereby obtaining the SOI substrate illustrated in FIG. 6C.

Figure 8:
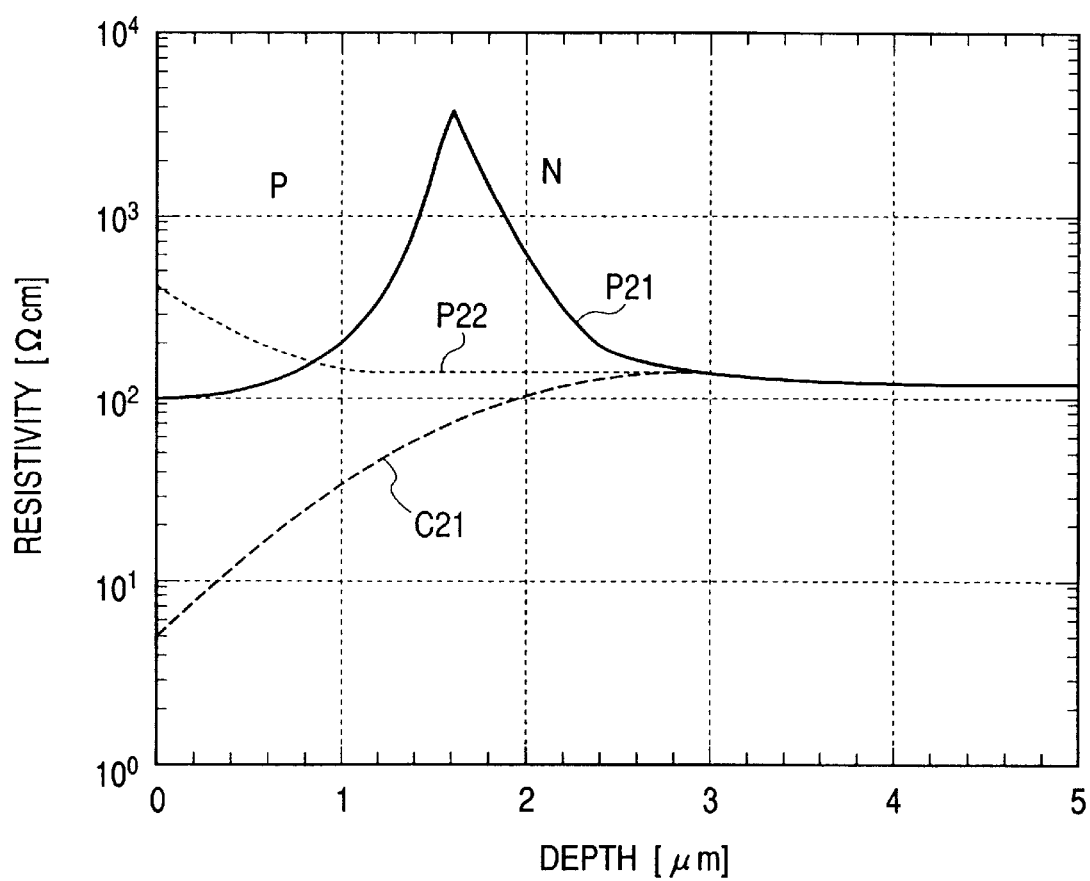
FIG. 8 is a graph showing the dependence of resistivity on the depth of various support substrates.

FIG. 8 shows depth dependence of resistivity in various support substrates.

FIG. 8 shows resistivity profiles (P21, P22) of support substrates where the n-type Si wafer having the resistivity of 150 Ωcm was used as the second base, and a resistivity profile (C21) of a support substrate where the p-type Si wafer was used as the second base.

P21 indicates the resistivity profile where the concentration Cp of a p-type impurity to penetrate from the bonding atmosphere into the second base was equal to the concentration Cn of an n-type impurity contained in the second base, and P22 the resistivity profile where the insulating layer was formed on the surface of the second base before the bonding.

P21 and P22 all show the profiles in which the resistivity becomes higher toward the surface of the support substrate, i.e., toward the interface with the insulating layer, and, therefore, they are left-increasing profiles in FIG. 8 in the vicinity of the buried insulating layer (at least within 3 µm from the interface).

Particularly, P22 has no region where the profile becomes decreasing to the left and has the higher resistivity near the interface than that of the bulk. Therefore, P22 is more preferable.

In the case where the p-type wafer having the resistivity of 150 Ωcm is used as the second base as indicated by C21, the p-type impurity diffuses from the bonding atmosphere into the wafer to decrease the resistivity near the interface considerably.

The bonding atmosphere used in the present invention does not mean only the atmosphere at the place where the bonding is carried out actually, but also means an atmosphere to create the actual bonding surface. Namely, where the concentration of a p-type or n-type impurity in the actual bonding atmosphere is so low as not to cause decrease of resistivity, it is dependent on an atmosphere immediately before placement of the second base in that atmosphere. In that case, therefore, the atmosphere immediately before the placement can also be regarded as a bonding atmosphere.

The concentration (Np) of a p-type impurity in the bonding atmosphere is preferably not more than 0.05 ng/liter and more preferably not more than 0.004 ng/liter and the concentration (Nn) of an n-type impurity in the bonding atmosphere is preferably not more than 0.01 ng/liter and more preferably not more than 0.002 ng/liter. In addition, it is necessary to satisfy the relation of Nn<Np.

As long as the relation of Nn<Np is met, lower limits of Nn, Np do not have to be defined; however, in order to facilitate management of the atmosphere and restrain the production and running cost, Nn and Np both are preferably not less than 0.001 ng/liter, for which an expensive and high-performance filter does not have to be used.

The above atmosphere can be an atmosphere formed in a clean room or in a local clean room of a high cleanliness placed in another clean room, or an atmosphere formed in a closed chamber.

In the former case, the principal component of the atmosphere is the clean air of cleanliness of class 1 to 1000 level as mentioned above, and in the latter case, the principal component of the atmosphere can be an inert gas such as nitrogen, argon, helium, neon, or xenon, or oxygen.

For example, when the boron-releasing HEPA filter is used as in Experiment 4, the boron concentration in the bonding atmosphere 20P of FIG. 7 becomes higher than the phosphorus concentration in the same atmosphere 20P. Therefore, when the p-type high-resistance wafer is used as the second base in the bonding in this atmosphere as in Experiments 2, 3, the resistivity profile thereof is the result as indicated by C21 of FIG. 8.

The second base used in the present invention is a base material containing at least a region comprising an n-type semiconductor having the resistivity not less than 100 Ωcm, more preferably the resistivity of not less than 500 Ωcm, and still more preferably the resistivity of not less than 1000 Ωcm on the bonding surface side.

When the insulating layer as a barrier is not formed, there are cases in which it is preferable to use the n-type semiconductor having the resistivity not less than 100 Ωcm nor more than 500 Ωcm, as the second base. Particularly, the FZ wafer with the above resistivity is preferably used, but the CZ wafer can also be applicable.

Further, it is also preferable to form the insulating layer on the bonding surface side of the above second base and thereafter bond the first base thereto with the surface of the insulating layer as a bonding surface.

In this case, since this insulating layer acts as a barrier against penetration of a p-type impurity, the region immediately below the buried insulating layer becomes more resistant to decrease of the resistivity. Silicon oxide is preferably used as such an insulating layer, and the thickness of the insulating layer enough for the action as a barrier is not less than 100 nm and more preferably not less than 200 nm nor more than 10 μm.

The two bases can be bonded to each other more easily without formation of voids or the like at the bonding interface when one of the bonding surfaces of the first and second bases to be bonded is a surface comprised of a semiconductor of Si or the like and the other is a surface comprised of an insulator such as silicon oxide or the like.

In cases where surfaces of insulators are bonded to each other, it is desirable to bond them after an element such as oxygen, nitrogen, silicon, or the like is introduced into at least one of the bonding surfaces.

(Embodiment 5)

Next described is Embodiment 5 resulting from partial modification of Embodiment 4 described above.

The surface of the p-type Si wafer as the first base 1 is anodized to make the surface porous. Then the semiconductor layer region of non-porous single-crystal Si is formed on the porous surface by epitaxial growth.

Then the surface of the semiconductor layer region 12 is oxidized to form the insulating layer 2 as occasion may demand.

Figure 9A:
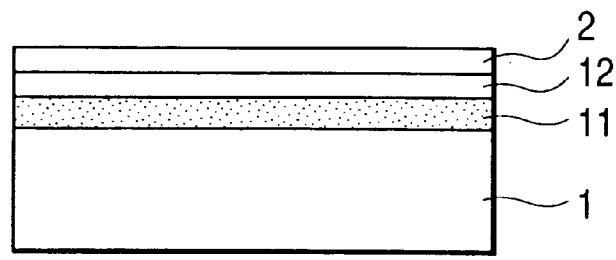
FIGS. 9A, 9B, 9C and 9D are schematic sectional views showing the steps of Embodiment 5 of the present invention.

In this way, the first base is obtained as illustrated in FIG. 9A.

Figure 9B:
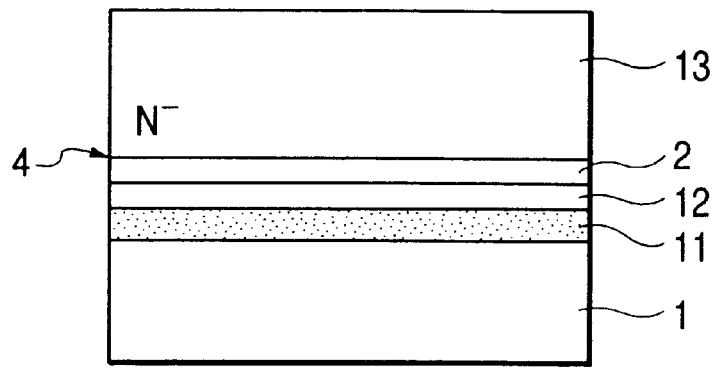

The second base 13 like the n-type FZ Si wafer with a high resistivity described in Embodiment 4 is prepared and is placed, together with the first base, in the bonding atmosphere where the n-type impurity concentration is low (Np>Nn). In the atmosphere they are placed so that the surface of the insulating layer 2 is in close contact with the surface of the n-type FZ wafer. At this time a heat treatment at 900° C. to 1200° C. is carried out as occasion may demand. In this way the multi-layer structure as illustrated in FIG. 9B is obtained.

Figure 9C:
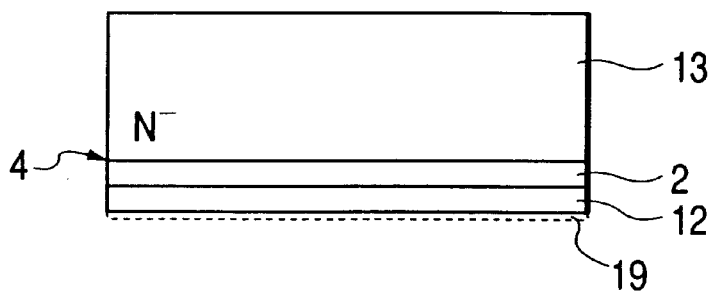

After that, the non-porous part on the surface side of the first base 1 is removed by grinding, polishing, or etching and the porous layer 11 is removed by selective wet etching with an etchant containing hydrogen fluoride and hydrogen peroxide, thereby obtaining the SOI substrate as illustrated in FIG. 9C.

Alternatively, a fluid or a wedge is driven against or into the side face of the multi-layer structure, or tension is applied in directions to separate the first base and the second base from each other, or the like, whereby the two members are separated from each other at the border of the porous layer with low mechanical strength, thereby obtaining the SOI substrate with the semiconductor layer region 12 being left on the second base 13.

Further, the substrate is subjected to a heat treatment in a reducing atmosphere of hydrogen 100% or in a reducing atmosphere of hydrogen diluted with an inert gas for one or more hours, whereby the rough surface of the semiconductor layer region is smoothed so that the surface roughness of the SOI substrate becomes sufficiently smooth to Rrms not more than 5 nm.

Figure 9D:
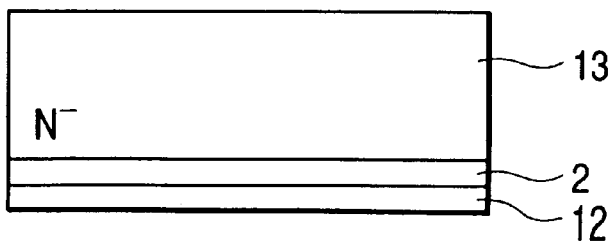

The SOI substrate as illustrated in FIG. 9D is obtained in this way.

Since in this SOI substrate the support substrate 13 below the buried insulating layer 2 has the sufficiently high resistivity of not less than 100 Ω·cm, the transistor produced with this SOI substrate has less leak current and can act at a high speed.

(Embodiment 6)

Embodiment 6 is also an example resulting from partial modification of Embodiment 4.

Figure 10A:
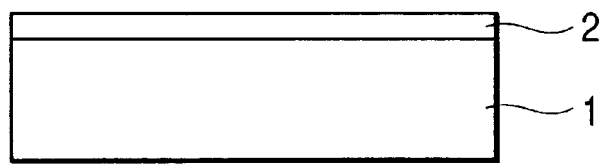
FIGS. 10A, 10B, 10C and 10D are schematic sectional views showing the steps of Embodiment 6 of the present invention.

As illustrated in FIG. 10A, the insulating layer 2 is formed on the surface of the first base 1 comprised of a semiconductor such as the Si wafer.

Figure 10B:
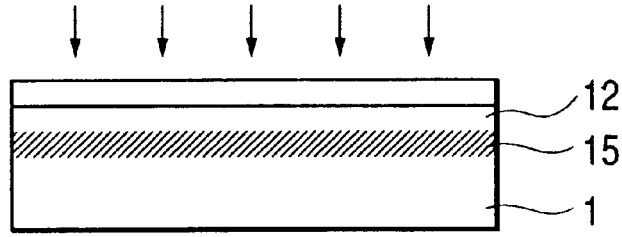

As illustrated in FIG. 10B, hydrogen ions or rare gas ions are implanted by ion implantation in the region about 100 nm to 2 μm below the lower surface of the insulating layer 2 of the first base 1 to form an ion-implanted layer 15 for creation of microbubbles. Then, it may be subjected to a heat treatment at 100° C. to 400° C. to evolve the microbubbles in the ion-implanted layer 15 if necessary.

Figure 10C:
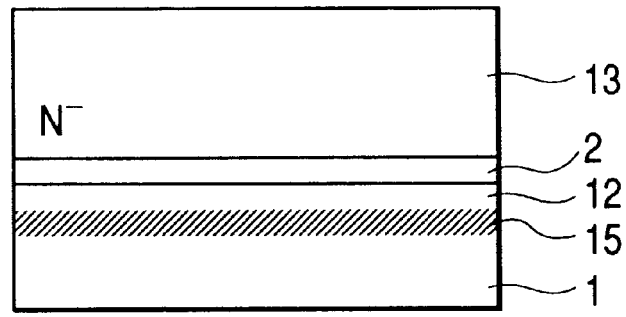

As illustrated in FIG. 10C, the second base 13, which is comprised of a semiconductor such as the high-resistance p-type Si wafer or the like as described in Embodiment 4, is prepared and is brought into close contact with the insulating layer 2 in the atmosphere 20P illustrated in FIG. 7. Then the substrate is subjected to a heat treatment at 500° C. to 1200° C. to aggregate the microbubbles evolved in the ion-implanted layer 15 or to newly evolve and aggregate the microparticles therein. Then the ion-implanted layer becomes fragile, and the first base 1 of the multi-layer structure is separated at the border of the ion-implanted layer 15 while the semiconductor layer region 12 is left.

Figure 10D:
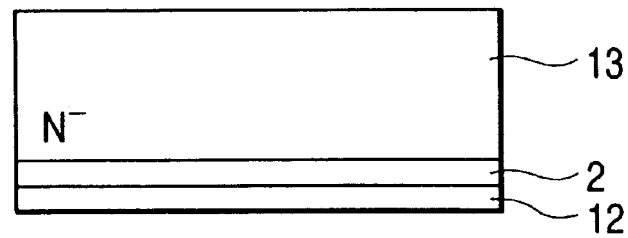

Then the exposed surface of the semiconductor region 12 is smoothed by polishing or by a heat treatment in a reducing atmosphere containing hydrogen to obtain the SOI substrate with relatively good quality, though inferior to that of Embodiment 4, as illustrated in FIG. 10D.

The SOI substrate thus obtained is one with the support substrate having the resistivity profile as indicated by either P21 or P22 of FIG. 8, depending on the penetration amount of impurities or the distribution state thereof.

Embodiments 7 to 9 described below are examples where the base becoming the support substrate is a high-resistance n-type semiconductor with an insulating film and where the atmosphere selected is one in which the concentration of a p-type impurity is lower than the concentration of an n-type impurity.

(Embodiment 7)

FIGS. 11A to 11D show another method of producing a semiconductor substrate according to the present invention.

Figure 11A:
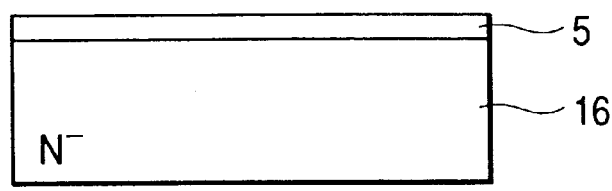
FIGS. 11A, 11B, 11C and 11D are schematic sectional views showing the steps of Embodiment 7 of the present invention.

As illustrated in FIG. 11A, the second substrate 16 prepared is one of a high-resistance n-type semiconductor having the resistivity of not less than 300 Ωcm, and the insulating layer 5 is formed at least on the upper surface thereof.

Figure 11B:
Figure 11C:
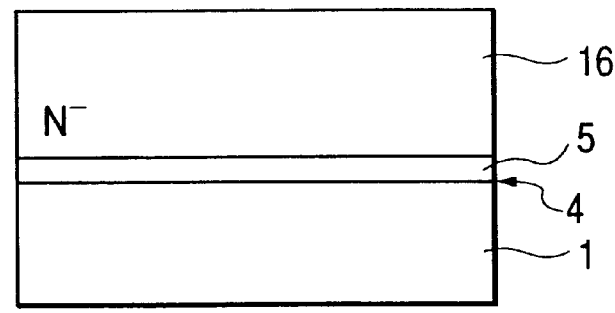

As illustrated in FIG. 11B, for example, the Si wafer is prepared as the first base 1.

The second base 16 having the insulating layer 5 on the bonding surface side, and the first base 1, prepared in this way, are bonded in the bonding atmosphere 20N as illustrated in FIG. 2. Numeral 4 designates the bonding interface.

FIG. 2 shows the bonding space provided in the clean room 23, in which 21N is the low-boron-releasing filter, for example such as the PTFE filter or the like, and/or the boron-adsorbing chemical filter, 22 the bulkhead, 24 the floor, and 30 the bonding device. The atmosphere 20N in this space is cleaned to the high cleanliness of class 1 as mentioned above or a higher cleanliness as occasion may demand.

From the multi-layer structure obtained by bonding of the first base 1 and the second base 16, the first base is removed except for the semiconductor layer region 12 near the side of the insulating layer 5 of the first base by one of the removing methods as in Embodiment 1.

Figure 11D:
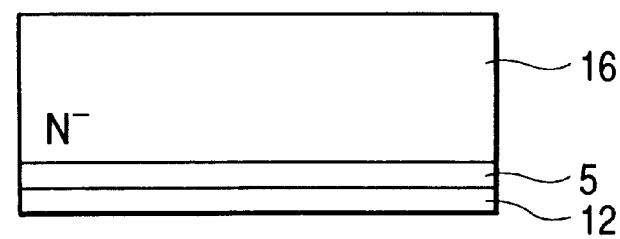

Further, the substrate obtained is subjected to a heat treatment in a reducing atmosphere containing hydrogen if necessary, thereby obtaining the SOI substrate illustrated in FIG. 11D.

Figure 12:
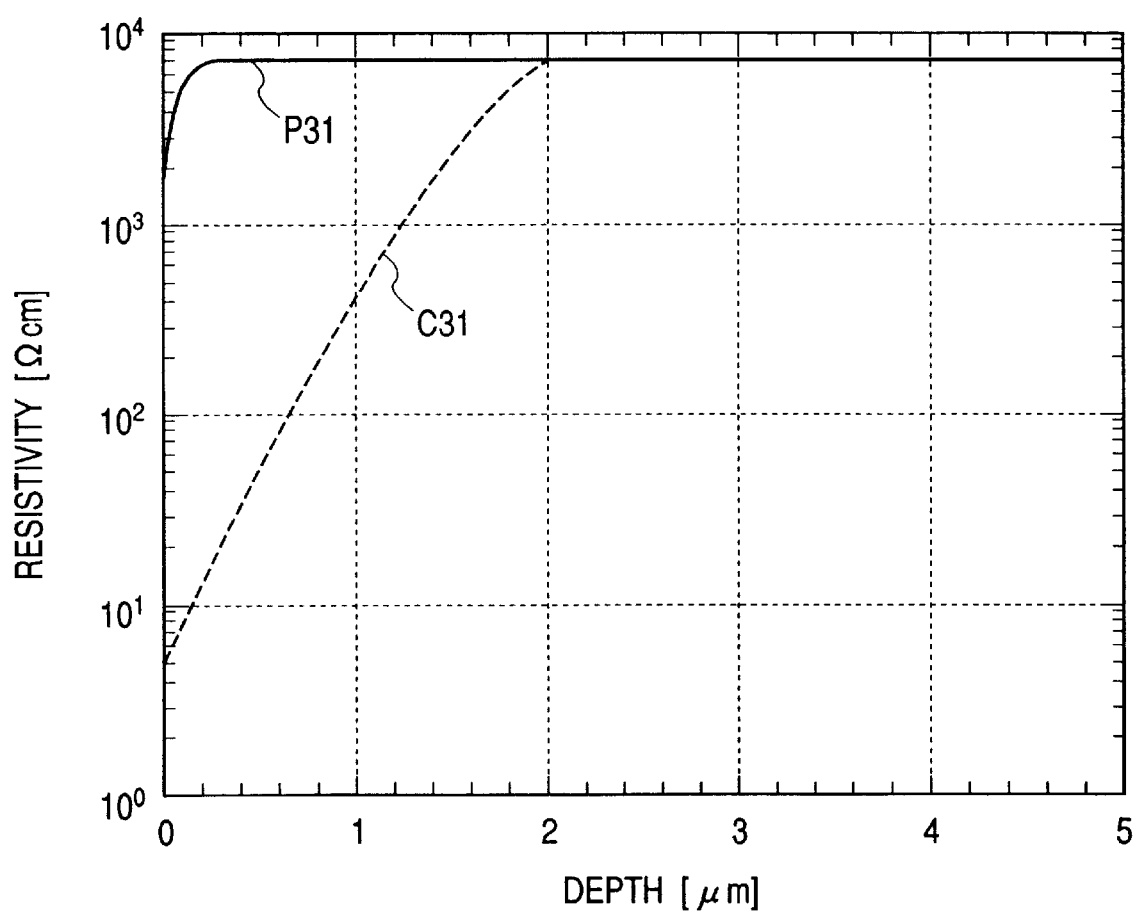
FIG. 12 is a graph showing the dependence of resistivity on the depth of a support substrate in accordance with Embodiment 7 of the present invention.

FIG. 12 shows depth dependence of resistivity in a support substrate according to the present embodiment.

FIG. 12 shows the resistivity profile (P31) of the support substrate where the bases were bonded to each other in an atmosphere containing a relatively large amount of an n-type impurity, using an n-type Si wafer of the resistivity 6000 Ωcm with the insulating layer formed on the surface, as the second base, and the resistivity profile (C31) of a support substrate as a comparative example.

P31 indicates the resistivity profile of the support substrate according to the present invention.

P31 demonstrates a profile in which the resistivity gradually decreases toward the interface with the insulating layer, i.e., a left-decreasing profile in FIG. 12, in the vicinity of the part immediately below the buried insulating layer (at least within 0.3 µm from the interface).

Particularly, in the case of P31, since the insulating layer 5 is formed on the second base before the bonding, this insulating layer acts to impede penetration of an impurity, so that there is little decrease of the resistivity near the interface.

As indicated by C31, in cases where the n-type wafer having the resistivity of 6000 Ωcm is used as the second base and where the bases are bonded to each other without forming the insulating layer as a barrier on the bonding surface of the second base, because the second base itself is the semiconductor of the low impurity concentration, more n-type impurity diffuses from the bonding atmosphere into the n-type wafer to form a region of relatively strong n-type near the interface and decrease the resistivity considerably even if the adsorption amount of the n-type impurity is extremely small (~1×10$^{11}$ atoms/cm$^2$).

The bonding atmosphere used in the present invention does not mean only the atmosphere at the place where the bonding is carried out actually, but also means an atmosphere to create the actual bonding surface. Namely, where the concentration of a p-type or n-type impurity in the actual bonding atmosphere is so low as not to cause decrease of resistivity, it is dependent on an atmosphere immediately before placement of the second base in that atmosphere. In that case, therefore, the atmosphere immediately before the placement can also be regarded as a bonding atmosphere.

The concentration (Nn) of an n-type impurity in the bonding atmosphere is preferably not more than 0.1 ng/liter and more preferably not more than 0.01 ng/liter and the concentration (Np) of a p-type impurity in the bonding atmosphere is preferably not more than 0.01 ng/liter and more preferably not more than 0.001 ng/liter. In addition, it is necessary to satisfy the relation of Nn>Np.

As long as the relation of Nn>Np is met, it is not significant to define the lower limits of Nn, Np; however, in order to facilitate management of the atmosphere and restrain the production and running cost, Nn and Np both are preferably not less than 0.0001 ng/liter, for example, by decreasing exchange frequency of filters.

The above atmosphere can be an atmosphere formed in a clean room or in a local clean room of a high cleanliness placed in another clean room, or an atmosphere formed in a closed chamber.

In the former case, the principal component of the atmosphere is the clean air of the high cleanliness of class 1 level as mentioned above, and in the latter case, the principal component of the atmosphere can be an inert gas such as nitrogen, argon, helium, neon, or xenon, or oxygen.

For example, in cases where the boron-releasing HEPA filter is used without using the PTFE filter, the boron concentration in the bonding atmosphere of the clean room becomes much higher than 0.01 ng/liter and higher than the phosphorus concentration in the same atmosphere. Therefore, when the bonding is carried out in such an atmosphere, it is hard to use the high-resistance p-type wafer as the second base. The reason is that the surface on the bonding surface side tends to become of much stronger p-type. In such cases the resistivity profile will have the surface side of lower resistance as indicated by C31 of FIG. 12.

The second base used in the present invention is a base having at least the bonding surface covered with an insulating layer and having at least a region comprising an n-type semiconductor immediately below the insulating layer, the n-type semiconductor having the resistivity of not less than 300 Ωcm, more preferably the resistivity of not less than 500 Ωcm, and still more preferably the resistivity of not less than 1000 Ωcm. Particularly, an FZ Si wafer with the above resistivity having the surface covered with the insulating layer is preferably used, but a CZ wafer covered with the insulating layer can also be applicable.

Further, it is also preferable to form the insulating layer on the surface of the above first base and thereafter bond it to the surface of the insulating layer of the second base, with the surface of the insulating layer of the first base being used as a bonding surface.

Since the insulating layer covering the surface of the second base acts as a barrier against penetration of a p-type impurity, the region immediately below the buried insulating layer becomes more resistant to decrease of the resistivity. Silicon oxide is preferably used as such an insulating layer, and the thickness of the insulating layer enough for the action as a barrier is not less than 100 nm and more preferably not less than 200 nm nor more than 10 µm.

The bonding surfaces of the first and second bases to be bonded can be bonded to each other more easily without formation of voids or the like at the bonding interface when the bonding surface of the first base is a surface comprised of a semiconductor of Si or the like and the other is a surface comprised of an insulator such as silicon oxide or the like.

In cases where surfaces of insulators are bonded to each other, it is more important to bond the surfaces after an element such as oxygen, nitrogen, silicon, or the like is introduced into at least one of the bonding surfaces by plasma ion implantation or the like.

(Embodiment 8)

Next described is Embodiment 8 resulting from partial modification of Embodiment 7 described above.

The surface of the p-type Si wafer as the first base 1 is anodized to make the surface porous. Then the semiconductor layer region 12 of non-porous single-crystal Si is formed on the porous surface by epitaxial growth.

Then the surface of the semiconductor layer region 12 is oxidized to form the insulating layer 2 as occasion may demand.

Figure 13A:
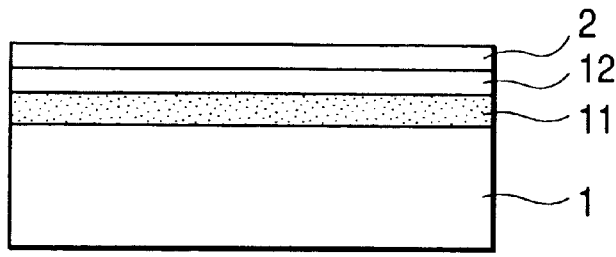
FIGS. 13A, 13B, 13C and 13D are schematic sectional views showing the steps of Embodiment 8 of the present invention.

In this way, the first base is obtained as illustrated in FIG. 13A.

Figure 13B:
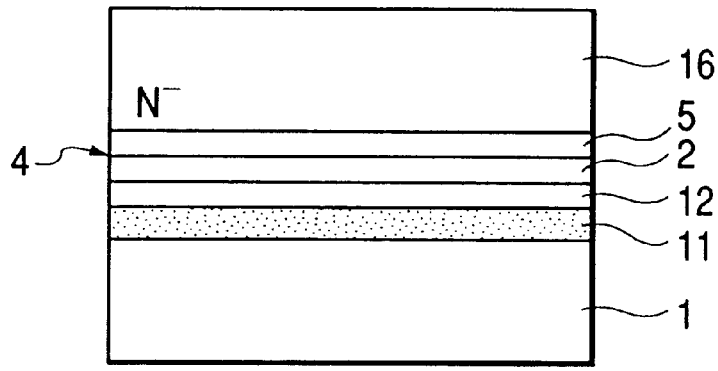

The second base 16 like the n-type FZ Si wafer of the high resistivity described in Embodiment 7 is prepared and the insulating layer 5 as a barrier is formed, for example, by thermal oxidation of at least the upper surface thereof or the like. Then the surface of at least one of the insulating layer 2 and the insulating layer 5 is subjected to a plasma process as occasion may demand. Then the second base, together with the first base, is placed in the bonding atmosphere having the low p-type impurity concentration (Np<Nn) and they are kept in close contact with each other. At this time a heat treatment is carried out at 900° C. to 1200° C. if necessary. The multi-layer structure as illustrated in FIG. 13B is obtained in this way.

Figure 13C:
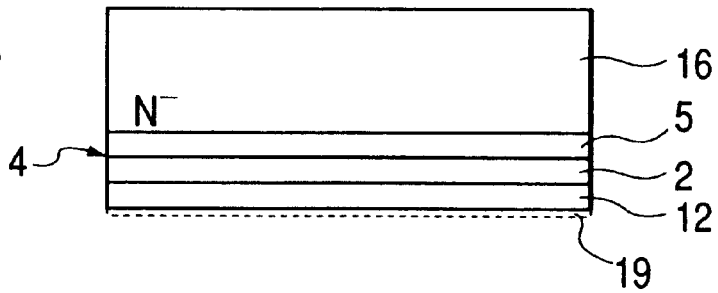

After that, the non-porous part on the surface side of the first base 1 is removed by grinding, polishing, etching, or the like and the porous layer 11 is removed by selective wet etching with an etchant containing hydrogen fluoride and hydrogen peroxide, thereby obtaining the SOI substrate as illustrated in FIG. 13C.

Alternatively, a fluid or a wedge is driven against or into the side face of the multi-layer structure, or tension is applied in directions to separate the first base and the second base from each other, or the like, whereby the two members are separated from each other at the border of the porous layer with low mechanical strength, thereby obtaining the SOI substrate with the semiconductor layer region 12 being left on the second base.

Further, the substrate is subjected to a heat treatment in a reducing atmosphere of hydrogen 100% or in a reducing atmosphere of hydrogen diluted with an inert gas for one or more hours, whereby the rough surface 19 of the semiconductor layer region is smoothed so that the surface roughness of the SOI substrate becomes sufficiently smooth to Rrms not more than 5 nm.

Figure 13D:
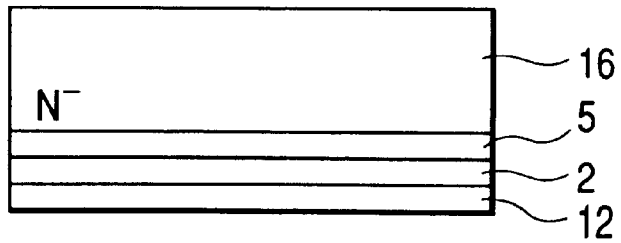

The SOI substrate as illustrated in FIG. 13D is obtained in this way.

Since in this SOI substrate the support substrate 16 below the buried insulating layer 2 has the sufficiently high resistivity of not less than 100 Ωcm and more preferably not less than 1000 Ωcm, the transistor produced with this SOI substrate has less parasitic capacitance and can operate at a high speed.

(Embodiment 9)

Embodiment 9 is also an example resulting from partial modification of Embodiment 7.

Figure 14A:
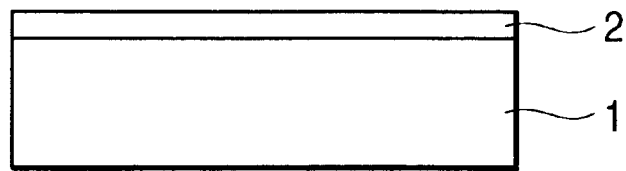
FIGS. 14A, 14B, 14C and 14D are schematic sectional views showing the steps of Embodiment 9 of the present invention.

As illustrated in FIG. 14A, the insulating layer 2 is formed on the surface of the first base 1 comprised of a semiconductor such as the Si wafer.

Figure 14B:

As illustrated in FIG. 14B, hydrogen ions or rare gas ions are implanted by ion implantation in the region about 100 nm to 2 μm below the lower surface of the insulating layer 2 of the first base 1 to form an ion-implanted layer 15 for creation of microbubbles. Then, it may be subjected to a heat treatment at 100° C. to 400° C. to evolve the microbubbles in the ion-implanted layer 15 if necessary.

Figure 14C:
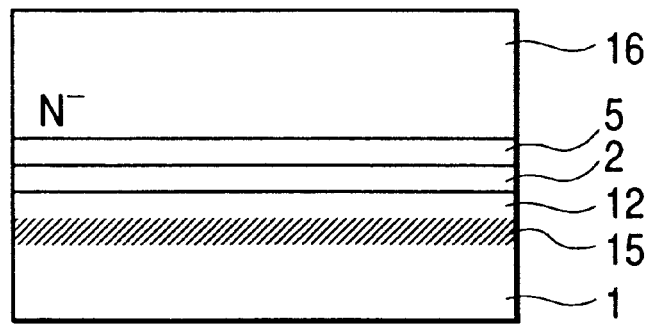

As illustrated in FIG. 14C, the second base 16, which is comprised of a semiconductor such as the high-resistance n-type Si wafer or the like as described in Embodiment 7, is prepared, and the insulating layer 5 to become a barrier is formed on the surface thereof. The second base is then kept in close contact with the insulating layer 2 in the atmosphere 20N illustrated in FIG. 2. Then the substrate is subjected to a heat treatment at 500° C. to 1200° C. to aggregate the microbubbles evolved in the ion-implanted layer 15 or to newly evolve and aggregate the microparticles therein. Then the ion-implanted layer becomes fragile, and the first base 1 of the multi-layer structure is separated at the border of the ion-implanted layer 15 while the semiconductor layer region 12 is left.

Figure 14D:
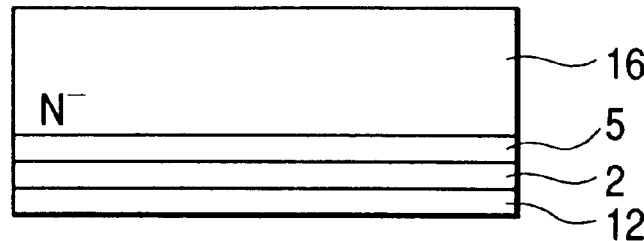

Then the exposed surface of the semiconductor region 12 is smoothed by polishing or by a heat treatment in a reducing atmosphere containing hydrogen to obtain the SOI substrate with relatively good quality, though inferior to that of Embodiment 7, as illustrated in FIG. 14D.

The SOI substrate thus obtained is one with the support substrate having the resistivity profile as indicated by P31 of FIG. 12.

(Embodiment 10)

Figure 15:
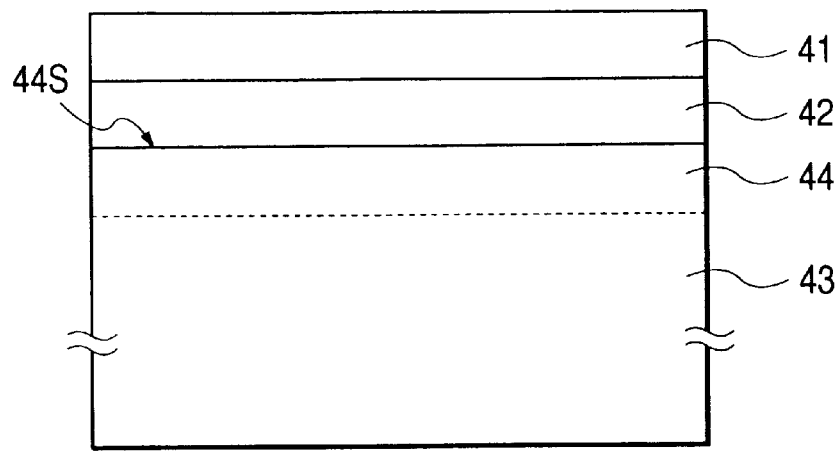
FIG. 15 is a schematic sectional view showing a semiconductor substrate in accordance with the present invention.

FIG. 15 is a schematic, sectional view of a semiconductor substrate according to the present invention.

This semiconductor substrate has a semiconductor layer region 41 of a single-crystal semiconductor through an insulating layer 42 on a support substrate 43 of a semiconductor, and the resistivity of semiconductor surface portion 44s immediately below the insulating layer 42 is not less than 100 Ωcm, more preferably not less than 500 Ωcm, and still more preferably not less than 1000 Ωcm.

Since the resistance of the semiconductor surface portion 44s is high as described above, the capacitance is low in the structure composed of the semiconductor layer region 41, the insulating layer 42, and the support substrate 43.

(Embodiment 11)

Figure 16:
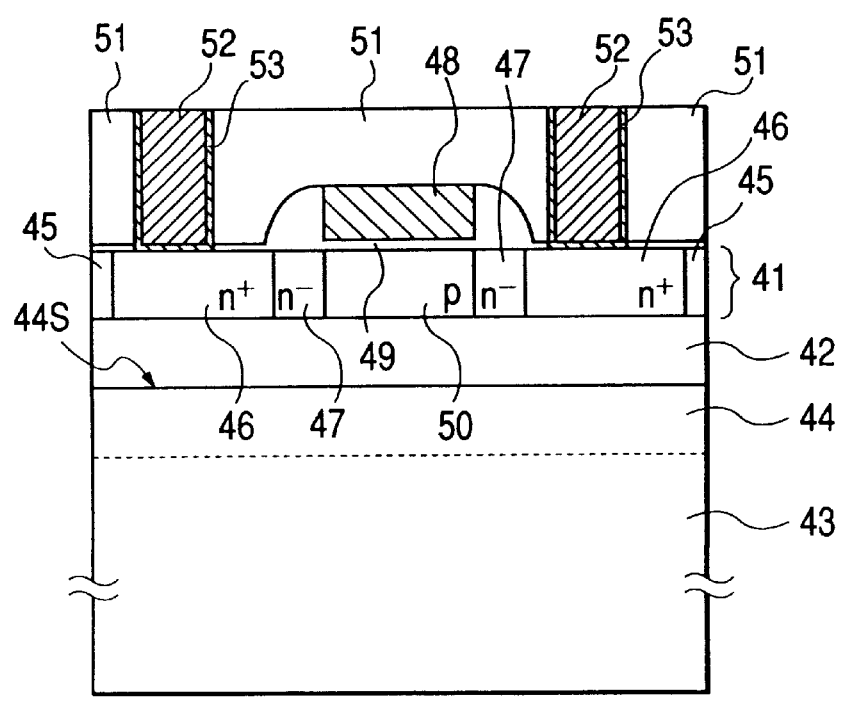
FIG. 16 is a schematic sectional view showing a semiconductor device in accordance with the present invention.

FIG. 16 is a schematic, sectional view of a semiconductor device according to the present invention.

This semiconductor device is produced by subjecting the semiconductor substrate illustrated in FIG. 15 to various processes and a transistor is fabricated in this semiconductor substrate.

In order to accomplish the LDD (Lightly Doped Drain) structure, source and drain regions 46, 47 of mutually different impurity concentrations are formed in the semiconductor layer region 41.

Numeral 45 designates an insulator for element isolation, 48 a gate electrode of polysilicon, silicide, metal, or the like, 49 a gate insulating film of silicon oxide or the like, 50 a channel region, 51 an insulating film, 52 source and drain electrodes of a metal such as aluminum, copper, or the like buried in contact holes formed in the insulating film 51, and 53 a barrier metal made of a high-melting-point metal (refractory metal), silicide, electrically conductive nitride, or the like.

An integrated circuit fabricated using the above-stated transistor according to the present invention demonstrates good high-frequency characteristics with little leak current and with a high cut-off frequency, because the region 44 near the semiconductor surface immediately below the buried insulating layer 42 has the high resistance.

Further, the transistor may also be any other transistor than the MOS transistor of the LDD structure; for example, a bipolar transistor or the like.

(Embodiment 12)

Embodiment 12 is an example in which there is a region with increasing resistivity toward the top in the figure in the vicinity 44 of the semiconductor surface in order to increase the resistance of the semiconductor surface portion 44s of the support substrate 43 illustrated in FIG. 15. Such a region with gradually increasing resistivity can be formed by forming a pn junction in the vicinity 44 of the semiconductor surface or by introducing a small amount of an impurity of the opposite conductivity type into the surface side of the semiconductor surface vicinity 44.

The present embodiment permits the resistivity of the semiconductor surface portion 44s of the support substrate 43 to be maintained readily in the range of not less than 100 Ωcm, more preferably in the range of not less than 500 Ωcm, and still more preferably in the range of not less than 1000 Ωcm.

EXAMPLE 1

A CZ wafer of p-type (100) single-crystal Si having the diameter of 6 inches and the thickness of 600 μm was anodized in 50% HF solution. The current density at this time was 10 mA/cm². A porous layer having the thickness of 20 µm was formed in the surface 10 minutes after. Then an Si epitaxial layer was grown in the thickness of 0.5 µm on this p-type porous Si layer by a low pressure CVD process. The deposition conditions were as follows.

Gas: $SiH_2Cl_2$ (0.6 liter/min), $H_2$ (100 liter/min)
Temperature: 850° C.
Pressure: 50 Torr
Growth rate: 0.1 µm/min.

Next, the surface of this epitaxial layer was thermally oxidized by the thickness of 50 nm. A p-type FZ Si wafer having the resistivity of 5000 Ωcm was overlaid on the thermally oxidized film of the resultant CZ wafer in a clean air atmosphere having the boron concentration of 0.0003 ng/liter and the phosphorus concentration of 0.001 ng/liter by the use of the system as illustrated in FIG. 2 and the two wafers were bonded to each other firmly by heating them at 900° C. for one and a half hours.

The concentrations of arsenic and antimony were negligibly lower than the boron concentration.

After that, the resultant substrate was ground by 580 µm from the back surface side of the CZ wafer, and then was subjected to reactive ion etching so as to expose the porous layer.

After that, the exposed porous layer underwent selective etching with a mixture solution of hydrofluoric acid and hydrogen peroxide. Only the single-crystal Si layer epitaxially grown was left without being etched 15 minutes after and the porous Si layer was completely removed selectively.

The etching rate of the non-porous Si single-crystal against the etchant was extremely low, approximately 40 Å even 15 minutes after, so that the etch selectivity of the etching rate of the porous Si layer was extremely large; therefore, etch amounts in the non-porous Si layer were almost practically negligible.

The SOI substrate formed in this way was put in the heat treatment furnace to be heat treated at 1150° C. in a 100% hydrogen atmosphere for four hours, thereby obtaining the SOI substrate smoothed to the surface roughness of Rrms=2 nm or less.

The support substrate below the buried insulating layer in this substrate was analyzed by SIMS analysis and it was verified that phosphorus penetrated up to the area around 1 µm from the surface to increase the phosphorus concentration therein.

Figure 17:
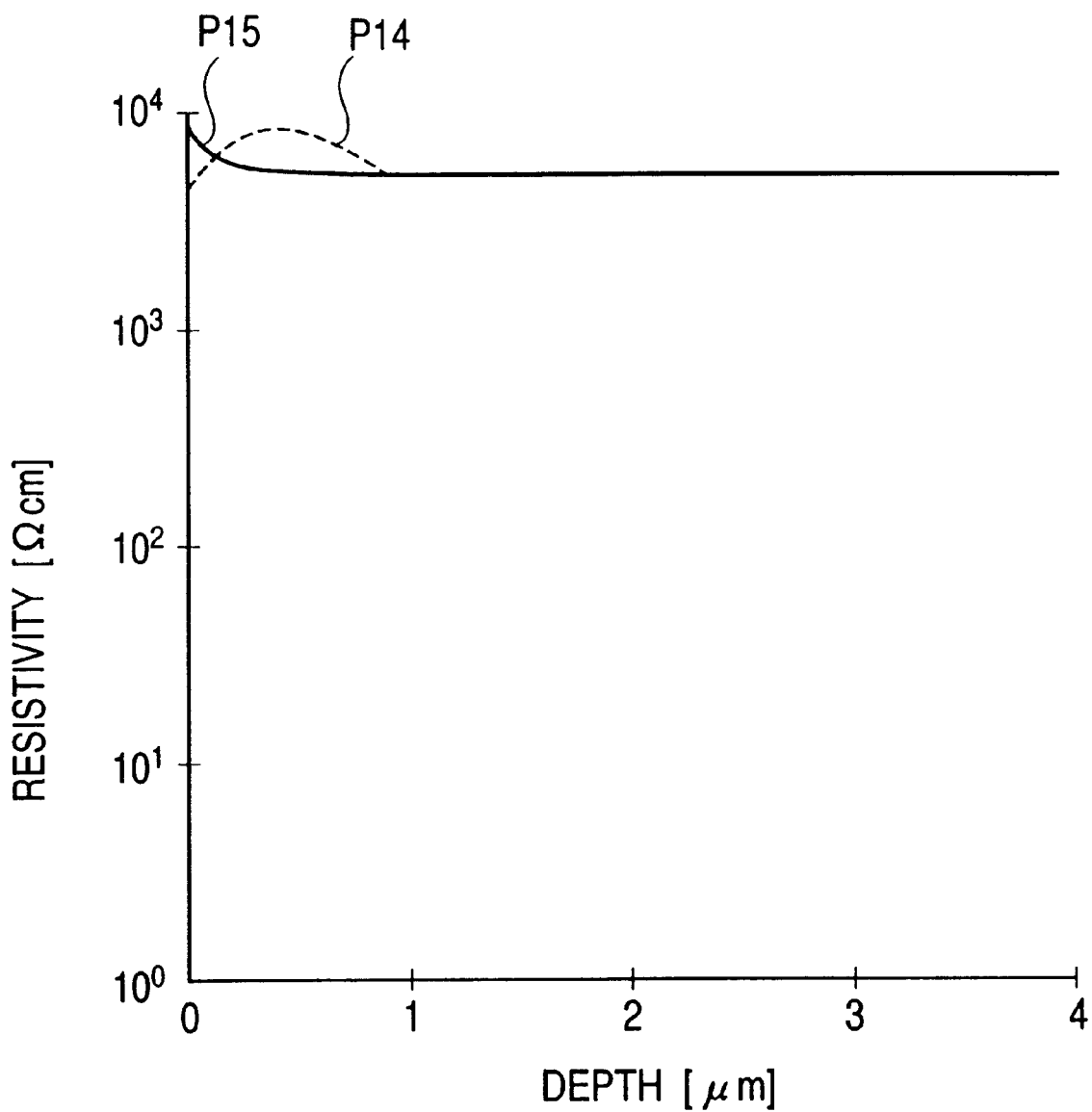
FIG. 17 is a graph showing the dependence of resistivity on the depth of an SOI substrate in accordance with Example 1 of the present invention.

The resistivity profile of the substrate is one indicated by P14 of FIG. 17. It is thus seen that the layer region with increasing resistivity toward the surface (the region 0.5 µm to 1 µm deep) is formed near the surface of the support substrate.

EXAMPLE 2

Before the bonding in Example 1, the surface of the p-type Si FZ wafer having the resistivity of 5000 Ωcm was thermally oxidized to form an insulating layer of silicon oxide in the thickness of 300 nm.

The bonding surface of the insulating layer was then exposed to a nitrogen plasma and thereafter the substrates were bonded to each other in the low-boron-concentration atmosphere as in Example 1.

The SOI substrate was obtained in like manner as in Example 1 except for the above.

The resistivity profile of the surface of the support substrate of this SOI substrate was one indicated by P15 of FIG. 17. It is thus seen that the layer region with gradually increasing resistivity toward the surface (the region 0 to 0.5 µm deep) is formed near the surface of the support substrate.

EXAMPLE 3

A CZ wafer of p-type (100) single-crystal Si having the diameter of 6 inches and the thickness of 600 µm was anodized in 50% HF solution. The current density at this time was 10 mA/cm². A porous layer having the thickness of 20 µm was formed in the surface 10 minutes after. Then an Si epitaxial layer was grown in the thickness of 0.5 µm on this p-type porous Si layer by the low pressure CVD process. The deposition conditions were as follows.

Gas: $SiH_2Cl_2$ (0.6 liter/min), $H_2$ (100 liter/min)
Temperature: 850° C.
Pressure: 50 Torr
Growth rate: 0.1 µm/min.

Next, the surface of this epitaxial layer was thermally oxidized by the thickness of 50 nm. An n-type FZ Si wafer having the resistivity of 150 Ωcm was overlaid on the thermally oxidized film thus obtained, in a clean air atmosphere having the boron concentration of 0.004 ng/liter and the phosphorus concentration of 0.002 ng/liter by the use of the system as illustrated in FIG. 7 and the two wafers were bonded to each other firmly by heating them at 900° C. for one and a half hours.

After that, grinding and reactive ion etching were carried out by 580 µm from the back surface side of the CZ wafer to expose the porous layer.

After that, the exposed porous layer underwent selective etching with the mixture solution of hydrofluoric acid and hydrogen peroxide. Only the single-crystal Si layer epitaxially grown was left without being etched 15 minutes after and the porous Si layer was completely removed selectively.

The SOI substrate formed in this way was put in the heat treatment furnace to be heat treated at 1150° C. in a 100% hydrogen atmosphere for four hours, thereby obtaining the SOI substrate smoothed to the surface roughness of Rrms=2 nm or less.

The support substrate below the buried insulating layer in this substrate was analyzed by SIMS analysis and it was verified that boron penetrated up to the area around 1 µm from the surface to increase the boron concentration therein.

Further, the resistivity profile was similar to that indicated by P21 of FIG. 8. It was thus verified that a pn junction was formed in the layer region (the region 0 to 3 µm deep) near the surface of the support substrate.

EXAMPLE 4

Before the bonding in Example 3, the surface of the n-type Si FZ wafer having the resistivity of 700 Ωcm was thermally oxidized to form an insulating layer of silicon oxide in the thickness of 300 nm.

The bonding surface of the insulating layer was then exposed to the nitrogen plasma and thereafter the substrates were bonded to each other in the high-boron-concentration atmosphere as in Example 3.

The SOI substrate was obtained in like manner as in Example 3 except for the above.

Figure 18:
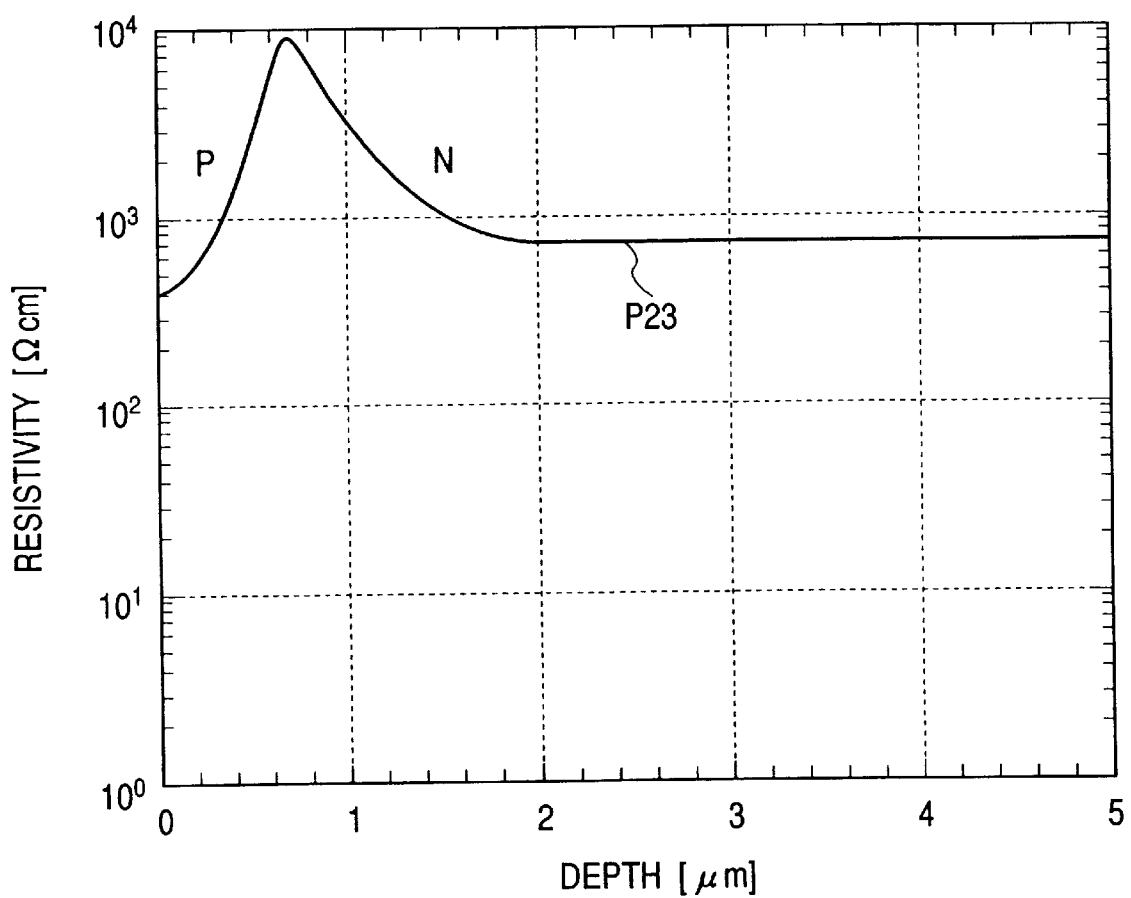
FIG. 18 is a graph showing the dependence of resistivity on the depth of an SOI substrate in accordance with Example 4 of the present invention.

The resistivity profile of the surface of the support substrate of this SOI substrate was one indicated by P23 of FIG. 18. It was thus verified that a pn junction was formed in the layer region (the region 0 to 2 µm deep) near the surface of the support substrate.

19

EXAMPLE 5

A CZ wafer of p-type (100) single-crystal Si having the diameter of 6 inches and the thickness of 600 μm was anodized in 50% HF solution. The current density at this time was 10 mA/cm². A porous layer having the thickness of 20 μm was formed in the surface of the CZ wafer 10 minutes after. Then an Si epitaxial layer was grown in the thickness of 0.5 μm on this p-type porous Si layer by the low pressure CVD process. The deposition conditions were as follows.

Gas: $SiH_2Cl_2$ (0.6 liter/min), $H_2$ (100 liter/min)

Temperature: 850° C.

Pressure: 50 Torr

Growth rate: 0.1 μm/min.

Besides it, an n-type FZ wafer having the resistivity of 6000 Ω·cm was prepared and the insulating layer becoming a barrier was formed in the thickness of 300 nm by thermal oxidation. The n-type FZ Si wafer having the resistivity of 6000 Ωcm and provided with the insulating layer was overlaid on the surface of the epitaxial layer in a clean air atmosphere having the boron concentration of 0.0003 ng/liter and the phosphorus concentration of 0.001 ng/liter by the use of the system as illustrated in FIG. 2 and the two wafers were bonded to each other firmly by heating them at 900° C. for one and a half hours. The concentrations of arsenic and antimony were negligibly smaller than the boron concentration.

After that, grinding and reactive ion etching were carried out by 580 μm from the back surface side of the CZ wafer to expose the porous layer.

After that, the porous layer underwent selective etching with the mixture solution of hydrofluoric acid and hydrogen peroxide. Only the single-crystal Si layer was left without being etched 15 minutes after and the porous Si layer was completely removed selectively.

The SOI substrate formed in this way was put in the heat treatment furnace to be heat treated at 1150° C. in the 100% hydrogen atmosphere for four hours, thereby obtaining the SOI substrate smoothed to the surface roughness of Rrms=2 nm or less.

The support substrate below the buried insulating layer in this substrate was analyzed by SIMS analysis and it was verified that phosphorus penetrated up to the area around 0.3 μm from the surface to increase the phosphorus concentration slightly therein.

Further, the resistivity profile of the substrate was similar to that indicated by P31 of FIG. 12.

EXAMPLE 6

Example 6 is different from Example 5 in that prior to the bonding in Example 5, an insulating layer of silicon oxide 50 nm thick was formed by thermal oxidation of the surface of the epitaxial layer on the CZ wafer as the first base.

Then the bonding surface of the insulating layer was exposed to the nitrogen plasma and thereafter the bonding surfaces were bonded to each other in the low-boron-concentration atmosphere as in Example 5.

The SOI substrate was obtained in like manner as in Example 5 except for the above.

The resistivity profile of the surface of the support substrate in this SOI substrate was one as indicated by P31 of FIG. 12.

According to the present invention, when producing an SOI substrate, it is possible to restrain the resistivity of the vicinity of the surface of the support substrate from decreasing near the surface of the support substrate immediately below the insulating layer, thereby providing a semiconductor substrate that can be an SOI substrate suitable for production of high-frequency transistors.

What is claimed is:

1. A method of producing a semiconductor substrate comprising a step of bonding a first base comprising a semiconductor layer region to a second base and a step of removing the first base while leaving the semiconductor layer region on the second base, wherein according to the composition of the second base, a magnitude relation is established so as to satisfy either $N_n > N_p$ or $N_n < N_p$ between the concentration of an n-type impurity ($N_n$) and the concentration of a p-type impurity ($N_p$) in an atmosphere for carrying out the bonding step.

2. A method of producing a semiconductor substrate comprising a step of bonding a first base comprising a semiconductor layer region to a second base and a step of removing the first base while leaving the semiconductor layer region on the second base, wherein, when at least a portion of the second base on the bonding surface side is an n-type semiconductor having a resistivity of not less than 100 Ωcm, the concentration of the n-type impurity is made lower than the concentration of the p-type impurity in the atmosphere in the bonding step, and wherein, when at least a portion of the second base on the bonding surface side is an n-type semiconductor having a resistivity of not less than 300 Ωcm and covered with an insulating layer, the concentration of the p-type impurity is made lower than the concentration of the n-type impurity in the atmosphere in the bonding step, and wherein when at least a portion of the second base on the bonding surface side is a p-type semiconductor having a resistivity of not less than 100 Ωcm, the concentration of the p-type impurity is made lower than the concentration of the n-type impurity in the atmosphere in the bonding step.

3. The method of producing the semiconductor substrate according to claim 1 or 2, wherein the concentration of the p-type impurity is the concentration of boron and the concentration of the n-type impurity is the concentration of phosphorus.

4. The method of producing the semiconductor substrate according to claim 1 or 2, wherein the concentration of the p-type impurity is the concentration of boron and is not more than 0.05 ng/liter, and wherein the concentration of the n-type impurity is the concentration of phosphorus and is not more than 0.1 ng/liter.

5. The method of producing the semiconductor substrate according to claim 1 or 2, wherein the second base is a floating zone (FZ).

6. The method of producing the semiconductor substrate according to claim 1 or 2, wherein in or after the bonding step, a heat treatment is carried out at a temperature not less than 900° C.

7. The method of producing the semiconductor substrate according to claim 1 or 2, wherein the resistivity of a semiconductor surface portion of the second base forming the semiconductor substrate is not less than 100 Ωcm.

8. The method of producing the semiconductor substrate according to claim 1 or 2, wherein a region with increasing resistivity toward a surface of the second base is formed in the vicinity of the semiconductor surface of the second base forming the semiconductor substrate.

9. A method of producing a semiconductor substrate comprising a step of bonding a first base comprising a semiconductor layer region to a second base and a step of removing the first base while leaving the semiconductor layer region on the second base, wherein the bonding step is carried out in an atmosphere in which the concentration of an n-type impurity is lower than the concentration of a p-type impurity, and wherein the second base is a base comprising a portion comprising an n-type semiconductor having a resistivity of not less than 100 Ωcm on the bonding surface side.

10. The method of producing the semiconductor substrate according to claim 9, wherein after an insulating layer is formed on a surface of the semiconductor layer region, the first base is bonded to the second base.

11. The method of producing the semiconductor substrate according to claim 9, wherein the second base has an insulating layer on the bonding surface side.

12. The method of producing the semiconductor substrate according to claim 9, wherein the concentration of the p-type impurity penetrating from the atmosphere into the second base is not less than 0.1 times nor more than 2 times the concentration of an n-type impurity in the second base.

13. The method of producing the semiconductor substrate according to claim 9, wherein the second base is an FZ Si wafer.

14. The method of producing the semiconductor substrate according to claim 9, wherein the atmosphere comprises clean air supplied through a boron-releasing filter.

15. The method of producing the semiconductor substrate according to claim 9, wherein the n-type impurity is phosphorus.

16. The method of producing the semiconductor substrate according to claim 9, wherein the p-type impurity is boron, and wherein the concentration of boron in the atmosphere is not more than 0.05 ng/liter.

17. The method of producing the semiconductor substrate according to claim 9, wherein the n-type impurity is phosphorus, and wherein the concentration of phosphorus in the atmosphere is not more than 0.01 ng/liter.

18. The method of producing the semiconductor substrate according to claim 9, wherein the first base comprises a porous layer or an ion-implanted layer.

19. The method of producing the semiconductor substrate according to claim 9, wherein the semiconductor layer region comprises a single-crystal semiconductor epitaxially grown on a porous single-crystal layer.

20. The method of producing the semiconductor substrate according to claim 9, wherein a heat treatment at 900° C. or higher is carried out in the bonding step.

21. The method of producing the semiconductor substrate according to claim 9, further comprising a step of carrying out a heat treatment to heat the semiconductor layer region left on the second base at 900° C. or higher.

22. The method of producing the semiconductor substrate according to claim 9, wherein the first base comprises a porous ion-implanted layer.

23. A method of producing a semiconductor substrate comprising a step of bonding a first base comprising a semiconductor layer region to a second base and a step of removing the first base while leaving the semiconductor layer region on the second base, wherein the bonding step is carried out in an atmosphere in which the concentration of a p-type impurity is lower than the concentration of an n-type impurity, and wherein the second base is a base comprising a portion comprising a p-type semiconductor having a resistivity of not less than 100 Ωcm on the bonding surface side.

24. The method of producing the semiconductor substrate according to claim 23, wherein after an insulating layer is formed on a surface of the semiconductor layer region, the first base is bonded to the second base.

25. The method of producing the semiconductor substrate according to claim 23, wherein the second base has an insulating layer on the bonding surface side.

26. The method of producing the semiconductor substrate according to claim 23, wherein the concentration of the n-type impurity penetrating from the atmosphere into the second base is not less than 0.1 times nor more than 2 times the concentration of a p-type impurity in the second base.

27. The method of producing the semiconductor substrate according to claim 23, wherein the second base is an FZ Si wafer.

28. The method of producing the semiconductor substrate according to claim 23, wherein the atmosphere comprises clean air supplied through a low-boron-releasing filter.

29. The method of producing the semiconductor substrate according to claim 23, wherein the p-type impurity is boron.

30. The method of producing the semiconductor substrate according to claim 29, wherein the concentration of the boron in the atmosphere is not more than 0.01 ng/liter.

31. The method of producing the semiconductor substrate according to claim 23, wherein the n-type impurity is phosphorus, and wherein the concentration of phosphorus in the atmosphere is not more than 0.1 ng/liter.

32. The method of producing the semiconductor substrate according to claim 23, wherein the first base comprises a porous layer or an ion-implanted layer.

33. The method of producing the semiconductor substrate according to claim 23, wherein the semiconductor layer region comprises a single-crystal semiconductor epitaxially grown on a porous single-crystal layer.

34. The method of producing the semiconductor substrate according to claim 23, wherein a heat treatment at 900° C. or higher is carried out in the bonding step.

35. The method of producing the semiconductor substrate according to claim 23, further comprising a step of carrying out a heat treatment to heat the semiconductor layer region left on the second base at 900° C. or higher.

36. The method of producing the semiconductor substrate according to claim 23, wherein the first base comprises a porous ion-implanted layer.

37. A method of producing a semiconductor substrate comprising a step of bonding a first base comprising a semiconductor layer region to a second base and a step of removing the first base while leaving the semiconductor layer region on the second base, wherein the bonding step is carried out in an atmosphere in which the concentration of a p-type impurity is lower than the concentration of an n-type impurity, and wherein the second base is a base comprising a portion comprising an n-type semiconductor having a resistivity of not less than 300 Ωcm and having an insulating layer formed on the bonding surface side.

38. The method of producing the semiconductor substrate according to claim 37, wherein after an insulating layer is formed on a surface of the semiconductor layer region, the first base is bonded to the second base.

39. The method of producing the semiconductor substrate according to claim 37, wherein the insulating layer is a layer of an oxide formed on the bonding surface side.

40. The method of producing the semiconductor substrate according to claim 37, wherein the resistivity of the second base is not less than 500 Ω·cm.

41. The method of producing the semiconductor substrate according to claim 37, wherein the second base is an FZ Si wafer.

42. The method of producing the semiconductor substrate according to claim 37, wherein the atmosphere comprises clean air supplied through a low-boron-releasing filter.

43. The method of producing the semiconductor substrate according to claim 37, wherein the p-type impurity is boron.

44. The method of producing the semiconductor substrate according to claim 43, wherein the concentration of the boron in the atmosphere is not more than 0.01 ng/liter.

45. The method of producing the semiconductor substrate according to claim 37, wherein the n-type impurity is phosphorus, and wherein the concentration of phosphorus in the atmosphere is not more than 0.1 ng/liter.

46. The method of producing the semiconductor substrate according to claim 37, wherein the first base comprises a porous layer or an ion-implanted layer.

47. The method of producing the semiconductor substrate according to claim 37, wherein the semiconductor layer region comprises a single-crystal semiconductor epitaxially grown on a porous single-crystal layer.

48. The method of producing the semiconductor substrate according to claim 37, wherein a heat treatment at 900° C. or higher is carried out in the bonding step.

49. The method of producing the semiconductor substrate according to claim 37, further comprising a step of carrying out a heat treatment to heat the semiconductor layer region left on the second base at 900° C. or higher.

50. The method of producing the semiconductor substrate according to claim 37, wherein the first base comprises a porous ion-implanted layer.

* * * * *